United States Patent
Lin et al.

(10) Patent No.: US 12,262,540 B2
(45) Date of Patent: Mar. 25, 2025

(54) SEMICONDUCTOR MEMORY DEVICES AND METHODS OF MANUFACTURING THEREOF

(71) Applicant: Taiwan Semiconductor Manufacturing Company, Ltd., Hsinchu (TW)

(72) Inventors: Meng-Han Lin, Hsinchu (TW); Chia-En Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 694 days.

(21) Appl. No.: 17/461,187

(22) Filed: Aug. 30, 2021

(65) Prior Publication Data

US 2022/0328525 A1   Oct. 13, 2022

Related U.S. Application Data

(60) Provisional application No. 63/172,167, filed on Apr. 8, 2021.

(51) Int. Cl.
| | |
|---|---|
| H10B 51/20 | (2023.01) |
| G11C 11/22 | (2006.01) |
| G11C 16/04 | (2006.01) |
| H10B 51/10 | (2023.01) |

(52) U.S. Cl.
CPC .......... H10B 51/20 (2023.02); G11C 11/2255 (2013.01); G11C 11/2257 (2013.01); G11C 16/0483 (2013.01); H10B 51/10 (2023.02)

(58) Field of Classification Search
CPC .... H10B 51/20; H10B 51/10; G11C 11/2255; G11C 11/2257; G11C 16/0483
See application file for complete search history.

(56) References Cited

U.S. PATENT DOCUMENTS

| | | | |
|---|---|---|---|
| 2020/0295031 A1* | 9/2020 | Lue | H10B 43/10 |
| 2020/0365612 A1* | 11/2020 | Hu | H10D 64/252 |
| 2020/0411539 A1* | 12/2020 | She | H01L 23/528 |

* cited by examiner

*Primary Examiner* — Benjamin Tzu-Hung Liu
(74) *Attorney, Agent, or Firm* — FOLEY & LARDNER LLP

(57) ABSTRACT

A semiconductor device includes a substrate including, in a first area, a first semiconductor channel coupled to a portion of a first memory layer, and first, second, and third conductive structures. The first and third conductive structures are coupled to end portions of a sidewall of the first semiconductor channel, with the second conductive structure coupled to a middle portion of the sidewall. The semiconductor device includes, in a second area, a second semiconductor channel coupled to a first portion of a second memory layer, and fourth and fifth conductive structures. The fourth and fifth conductive structures are coupled to end portions of a sidewall of the second semiconductor channel, with no vertically extending conductive structure interposed between the fourth and fifth conductive structures.

20 Claims, 14 Drawing Sheets

SEMICONDUCTOR MEMORY DEVICES AND METHODS OF MANUFACTURING THEREOF

CROSS-REFERENCE TO RELATED APPLICATION

This application claims priority to and the benefit of U.S. Provisional Application No. 63/172,167, filed Apr. 8, 2021, entitled "3D MEMORY INTEGRATION," which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. Recently, three dimensional (3D) memory devices have been introduced as the next generation memory device of choice for computing-in-memory (CIM) applications because the memory devices provide lower area and high performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
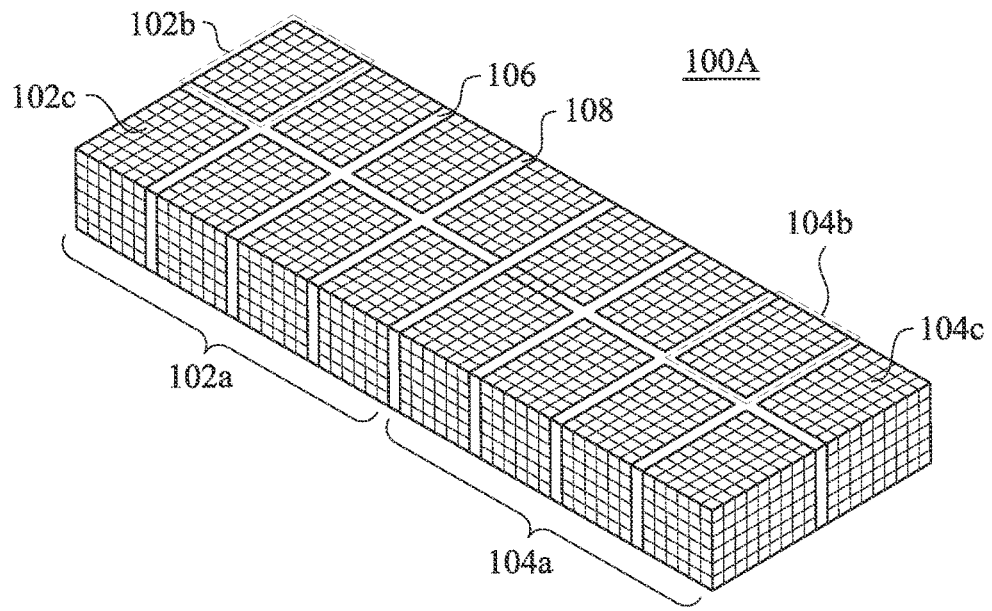
FIGS. 1A and 1B respectively illustrate two example structures of a 3D memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, 3D memory systems have been growing in popularity for their ability to have high performance, low power, and area reduction. Still, there is a growing need for memory devices that are both fast and able to store a dense amount memory in various applications such as CIM applications. For CIM applications, memory devices can have multiple functions such as storing memory but also computing. In order to optimize performance and area reduction, it is advantageous for the memory device that is used for storing memory and the memory device for computing have different structures and operations. In the existing technologies that do not use the disclosed devices and methods, 3D memory chips have only one type of memory that can disadvantageously limit the multi-functionality of CIM applications. Thus, the existing 3D memory systems have not been entirely satisfactory in every aspect.

The present disclosure relates to a 3D memory device and methods of manufacturing the same. The 3D memory device, as disclosed herein, includes two types of memory cells. Each type of memory cell can form their own array and banks, and those banks can be formed adjacent to each other. The first type of memory array can include high-endurance memory cells that can be used for high-bandwidth computing. The second type of memory array can include 2-bit memory cells which can be used for mass data storage. By having the two types of memory arrays fabricated on the same chip, the memory device can be used, for example, for CIM applications. In various embodiments, the high-endurance memory cells share source/select line between two adjacent memory cells, and the 2-bit memory cells store more data in a given area. Accordingly, the memory device can include a higher number of 3D memory devices to reduce a cost of fabrication per 3D memory system. By including two types of memory cells on the same chip, even more area can be reduced on a circuit board because two different types of memory chips are not needed. Furthermore, for next generation CIM applications, it is beneficial to have the computing and data storage memories close to each other because it reduces latency and increases performance.

Figure 1B:
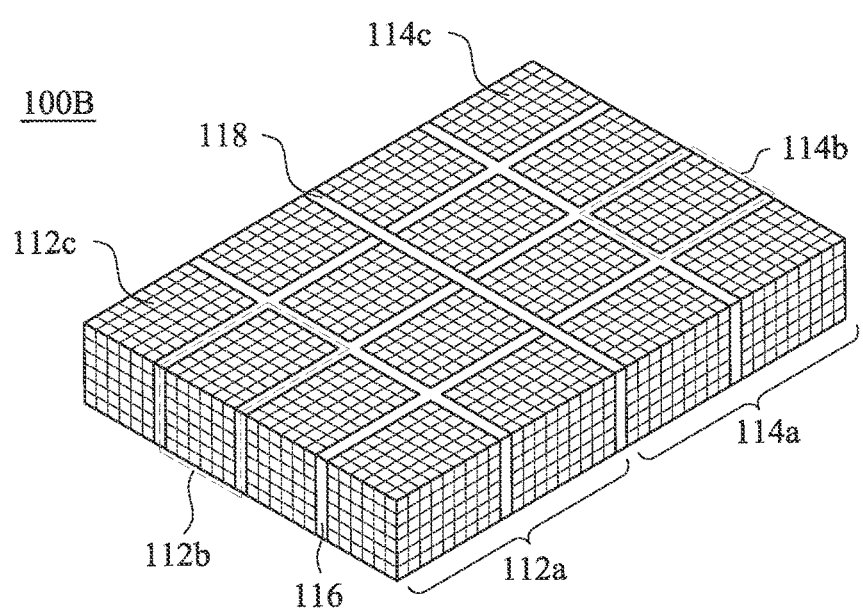

FIGS. 1A and 1B respectively illustrate two example structures of a 3D memory device, in accordance with some embodiments. It should be appreciated that the 3D memory device of FIGS. 1A-B are merely illustrative examples, and thus, the 3D memory device can include any of various other components, while remaining within the scope of present disclosure.

Figure 3A:
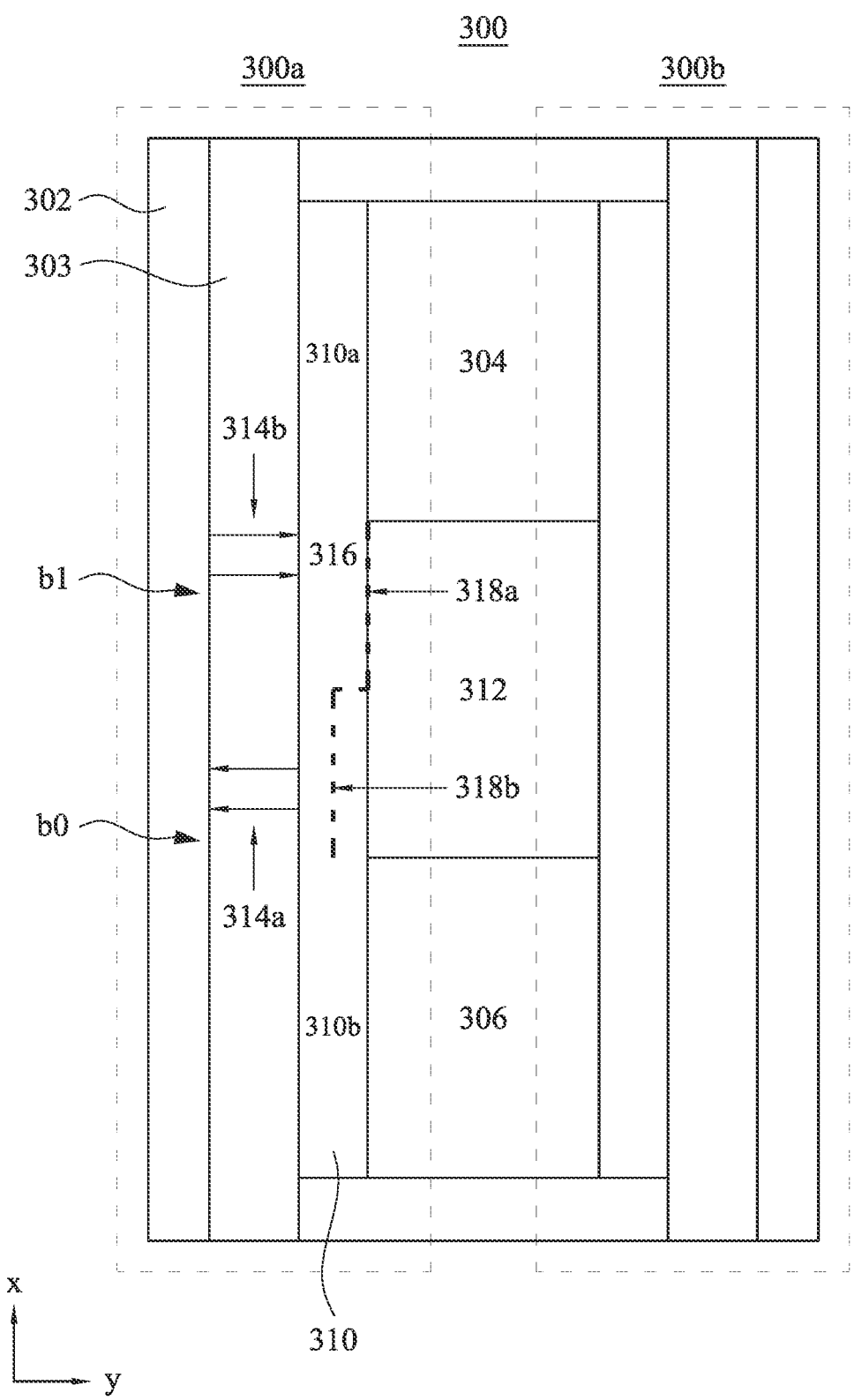
FIG. 3A illustrates a cross section of a 2-bit memory cell, in accordance with some embodiments.
Figure 3B:
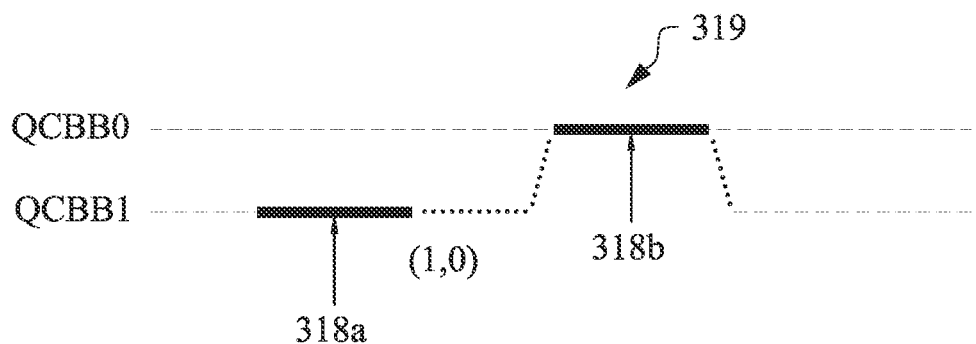
FIGS. 3B, 3C, and 3D illustrate waveforms that illustrate the operation of the 2-bit memory cell of FIG. 3A, in accordance with some embodiments.
Figure 3C:
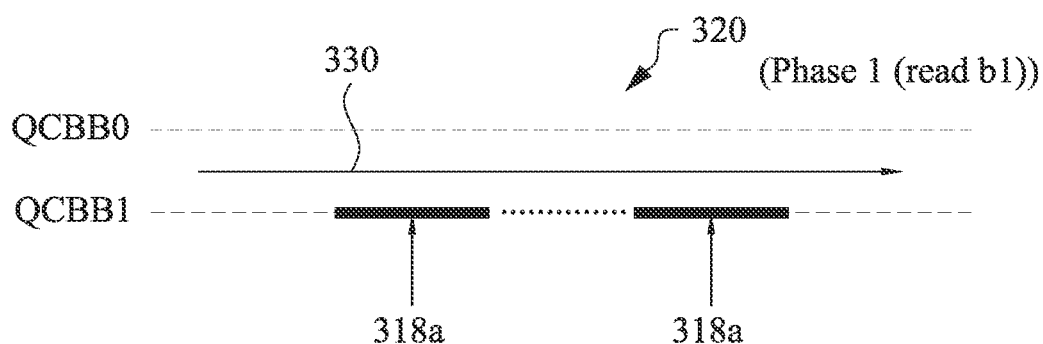
Figure 3D:
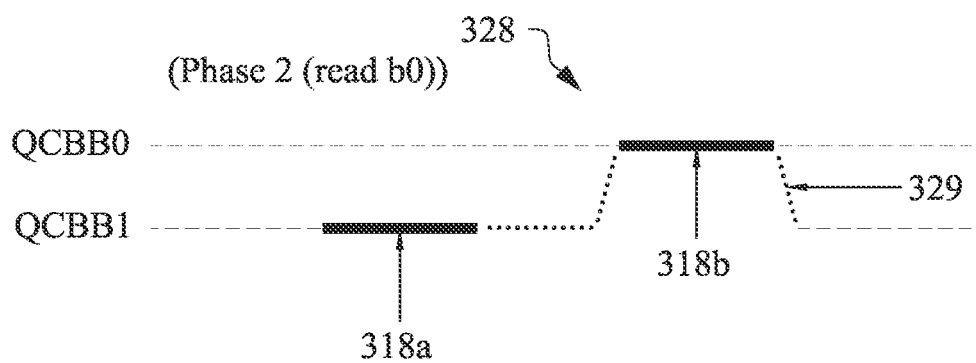

Referring first to FIG. 1A, 3D memory device 100A includes a memory bank 102a, a memory bank 104a, and a bank isolation region 108. The memory bank 102a includes a plurality of memory arrays (or sub-arrays) 102b, which includes a plurality of memory cells 102c. The memory bank 104a includes a plurality of memory arrays (or sub-arrays) 104b, which includes a plurality of memory cells 104c. Memory arrays 102b are separated from each other within the memory bank 102a by sub-array isolation layers 106, and the memory arrays 104b are separated from each other within the memory bank 104a by the sub-array isolation layers 106. The bank isolation region 108 includes an insulation layer that separates the memory bank 102a and memory bank 104a from each other. Although the memory device 100A is shown to have a certain number of cells, embodiments are not limited thereto, and there can be more or fewer memory cells and still be within the scope of the present disclosure. Furthermore, the memory cells 102 and 104 are shown to have a cubic shape for simplicity purposes only and embodiments are not limited thereto.

The memory device 100A includes a 2×4 structure on both of the memory banks 102a and 104a. There are 2 rows and 4 columns of memory arrays 102b in the memory bank 102a, and 2 rows and 4 columns of memory arrays 104b in memory bank 104a. However, embodiments are not limited thereto, and the memory device 100A can include any combination of memory arrays 102b and 104b.

The memory cells 102c can include high endurance 3D ("HE") memory cells in which two adjacent HE memory cells are connected to a common source/select line ("SL"). The memory cell 102b can be advantageous for high-bandwidth computing operations because the common SL can be used to increase performance. The memory cell 104b can include a 2-bit 3D memory cell that can be used for mass data storage before computing because the 2 bits per cell can increase density. In this disclosure, the memory cells 102b and 104b include ferroelectric memory cells, but embodiments are not limited thereto, and any type of 3D memory cell can be used.

Referring next to FIG. 1B, 3D memory device 100B includes a memory bank 112a, a memory bank 114a, and a bank isolation region 118. The memory bank 112a includes a plurality of memory arrays (or sub-arrays) 112b, which includes a plurality of memory cells 112c. The memory bank 114a includes a plurality of memory arrays (or sub-arrays) 114b, which includes a plurality of memory cells 114c. Memory arrays 112b are separated from each other within the memory bank 112a by sub-array isolation layers 116, and the memory arrays 114b are separated from each other within the memory bank 114a by the sub-array isolation layers 116. The bank isolation region 118 includes an insulation layer that separates the memory bank 112a and memory bank 114a from each other. Although the memory device 100B is shown to have a certain number of cells, embodiments are not limited thereto, and there can be more or fewer memory cells and still be within the scope of the present disclosure. Furthermore, the memory cells 112 and 114 are shown to have a cubic shape for simplicity purposes only and embodiments are not limited thereto.

The memory cells 112c can include high endurance 3D ("HE") memory cells in which two adjacent HE memory cells are connected to a common source/select line. The memory cell 112b can be advantageous for high-bandwidth computing operations because the common SL can be used to increase performance. The memory cell 114b can include a 2-bit 3D memory cell that can be used for mass data storage before computing because the 2 bits per cell can increase density. In this disclosure, the memory cells 112b and 114b include ferroelectric memory cells, but embodiments are not limited thereto, and any type of 3D memory cell can be used.

The memory device 100B includes a 4×2 structure on both of the memory banks 112a and 114a. There are 4 rows and 2 columns of memory arrays 112b in the memory bank 112a, and 4 rows and 2 columns of memory arrays 114b in memory bank 114a. However, embodiments are not limited thereto, and the memory device 100B can include any number of rows and columns of memory arrays 112b and 114b.

Figure 2A:
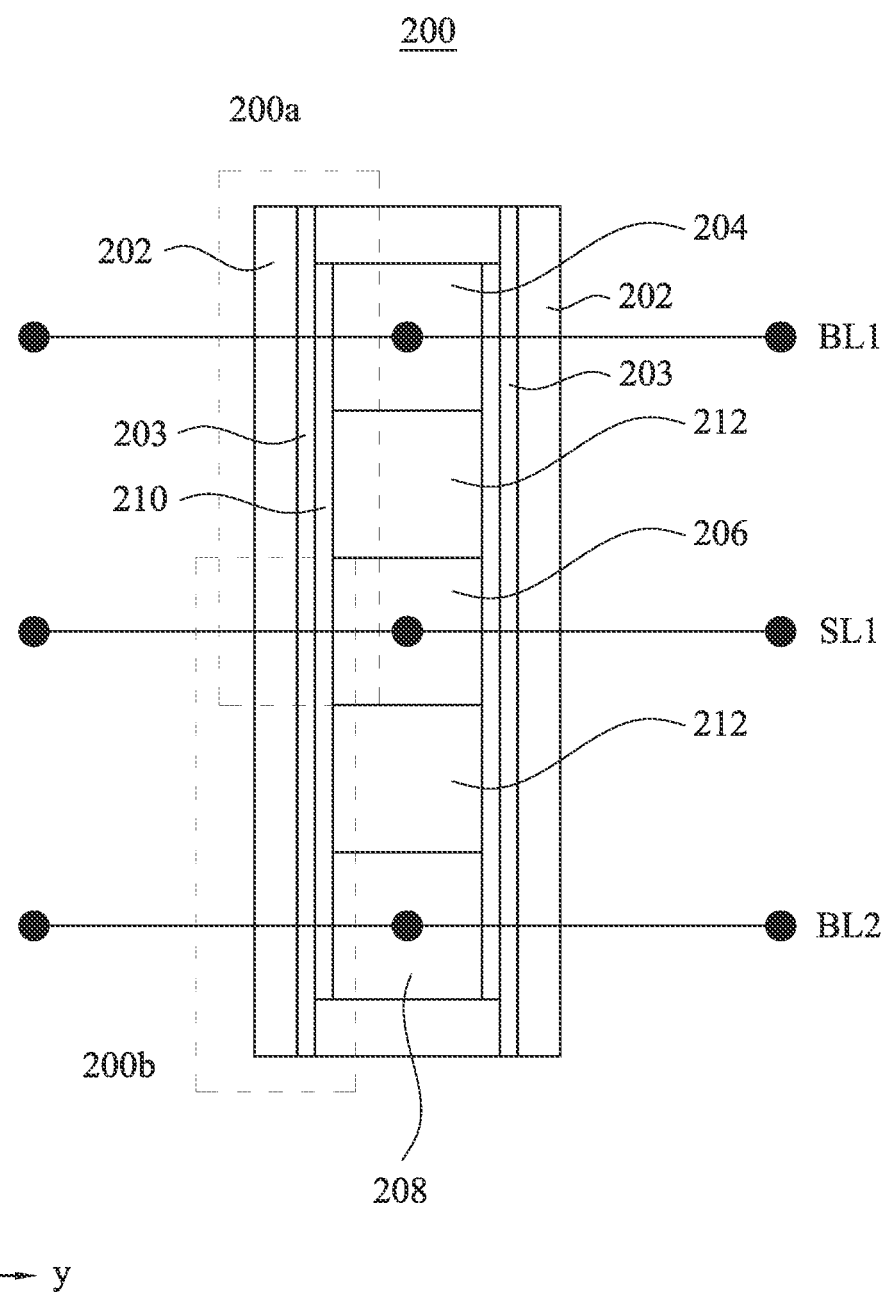
FIG. 2A illustrates a cross-sectional view of a memory structure, in accordance with some embodiments.

FIG. 2A illustrates a cross-sectional view of an example memory structure 200 of a number of the disclosed HE memory cells (e.g., 102c, 112c of FIGS. 1A-B), in accordance with some embodiments.

The memory structure 200 includes a pair of gate electrodes (or gate stacks) 202, a pair of memory layers 203, and a pair of semiconductor channels 210. Each of the gate electrodes 202 is disposed on one of the sides of the memory structure 200; each of the memory layers 203 is disposed on one of the sides of the memory structure 200; and each of the semiconductor channels 210 is disposed on one of the sides of the memory structure 200, as illustrated in FIG. 2A. Further, the memory structure 200 includes first and second bit lines (BL) 204 and 208 and common select/source line (SL) 206 interposed between (e.g., coupled to) such pairs of gate electrodes 202, memory layers 203, and semiconductor channels 210. The BLs 204 and 208 and SL 206 can be electrically isolated from one another by an isolation region 212. Each of the gate electrode 202, memory layers 203, semiconductor channels 210, BL 204, SL 206, BL 208 is formed as an upright structure that extends along a vertical direction, which will be discussed in further detail below.

In some embodiments, a first portion of one of the semiconductor channels 210, a first portion of one of the memory layers 203, and a first portion of one of the gate electrodes 202 can at least partially form an HE memory cell 200a; and a second portion of one of the semiconductor channels 210, a second portion of one of the memory layers 203, and a second portion of one of the gate electrodes 202 can at least partially form an HE memory cell 200b, as illustrated in FIG. 2A. Although a certain number of structures are shown for simplicity and clarity, and embodiments are not limited thereto. Furthermore, the shapes and sizes of the structures are not necessarily drawn to scale. Although this disclosure includes a detailed description of a ferroelectric transistor for the HE memory cell, embodiments are not limited thereto, and any non-volatile 3D memory is within the scope of disclosure.

To operate the HE memory cells 200a and 200b, the semiconductor channel 210 includes a first source/drain (S/D) region coupled to the first BL 204, a second S/D region coupled to the common SL 206, and a third S/D region coupled to the second BL 208. The HE memory cell 200a can include the first and second S/D regions of the semiconductor channel 210, and the HE memory cell 200b can include the second and third S/D regions of the semiconductor channel 210. Accordingly, the HE memory cells 200a and 200b can share the second S/D region which is connected to the common SL 206. During operation, a conductive channel can be formed in the semiconductor channel 210 between the first and second S/D regions, and another conductive channel can be formed in the semiconductor channel 210 between the second and third S/D.

The gate electrode 202 can be connected or also be part of a word line (WL). The memory layer 203 can be formed of ferroelectric material, and dipoles are dispersed throughout the memory layer 203. A memory device includes such a ferroelectric material serving as its memory layer is sometimes be referred to as a ferroelectric memory device, which will be discussed in further detail below.

In general, a ferroelectric memory device (sometimes referred to as a "ferroelectric random access memory (FeRAM)" device or a ferroelectric field effect transistor (FeFET)) contains a ferroelectric material to store information. The ferroelectric material acts as the memory material of the memory device. The dipole moment of the ferroelectric material is programmed in two different orientations (e.g., "up" or "down" polarization positions based on oxygen atom position in the crystal lattice) depending on the polarity of the applied electric field to the ferroelectric material to store information in the ferroelectric material. The different orientations of the dipole moment of the ferroelectric material can be detected by the electric field generated by the dipole moment of the ferroelectric material. For example, the orientation of the dipole moment can be detected by measuring electrical current passing through a semiconductor channel provided adjacent to the ferroelectric material. Although the following discussed embodiments of the disclosed 3D memory device are directed to a ferroelectric memory device, it should be appreciated that some of the embodiments may be used in any of various other types of 3D non-volatile memory devices (e.g., magnetoresistive random access memory (MRAM) devices, phase-change random access memory (PCRAM) devices, etc.), while remaining within the scope of the present disclosure.

A ferroelectric memory device (e.g., FeFET) can encode its datum in its threshold voltage. When the dipole moment is programmed to have an "up" polarization position, the threshold voltage of the ferroelectric memory device has a threshold voltage that is raised to a high threshold voltage (HVT) state (e.g., logic 1). When the dipole moment is programmed to have a "down" polarization position, the threshold voltage of the ferroelectric memory device has a threshold voltage that is lowered to a low threshold voltage (LVT) state (e.g., logic 0).

The memory cell 200a can be programmed to have the LVT state by setting the word line (connected to the gate electrode 202) to a program voltage $V_{pgm}$, the first BL 204 to about 0V, and the common SL 206 to about 0V. The memory cell 200a can be programmed to have the HVT state (or erased) by setting the word line to the $-V_{pgm}/2$, the first BL 204 to $V_{pgm}/2$, and the common SL to about 0V. Similarly, the memory cell 200b can be programmed to have the LVT state by setting the word line to the program voltage $V_{pgm}$, the second BL 208 to about 0V, and the common SL 206 to about 0V. The memory cell 200a can be programmed to have the HVT state (or erased) by setting the word line to the $-V_{pgm}/2$, the second BL 208 to the $V_{pgm}/2$, and the common SL to about 0V. When the memory cell 200a or 200b is in an LVT state, the memory cell 200a or 200b stores the logic 0, and when the memory cell 200a or 200b is in an HVT state, the memory cell 200a or 200b stores the logic 1.

The above-described (e.g., voltage) signals can be applied to the BL(s)/SL through respective interconnect structures. For example in FIG. 2A, the memory structure 200 further includes an interconnect structure (e.g., electrically) coupled to the first BL 204, hereinafter "bit line 1 (BL1)." The BL1 can extend along a lateral direction (e.g., Y direction) perpendicular to a lengthwise direction of the gate electrodes 202, memory layers 203, and semiconductor channels 210, as shown. The memory structure 200 further includes an interconnect structure (e.g., electrically) coupled to the common SL 206 and to the second BL 208, hereinafter "source line 1 (SL1)" and "bit line 2 (BL2)," respectively. Similarly, the SL1 and BL2 can extend in parallel with the BL1.

Figure 2B:
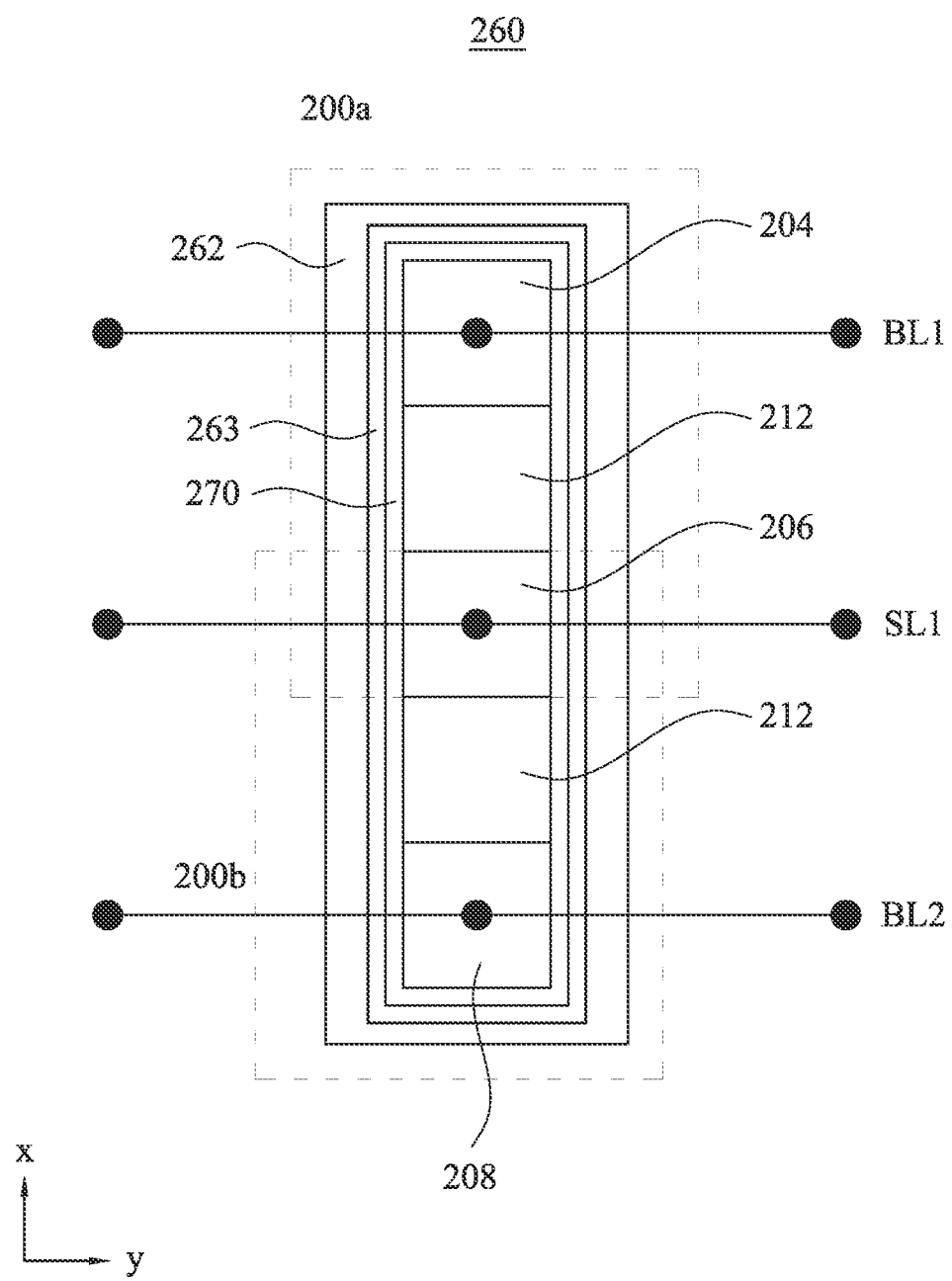
FIG. 2B illustrates a top view of the memory structure of FIG. 2A, in accordance with some embodiments.

FIG. 2B illustrates a cross-sectional view of a memory structure 260, in accordance with some embodiments. The memory structure 260 is similar to the memory structure 200 of FIG. 2A except that the memory layer 263 (similar to the memory layer 203) laterally surrounds the semiconductor channel 270 (similar to the semiconductor channel 210), and the gate electrode 262 (similar to the gate electrode 202) laterally surrounds the memory layer 263. As such, in the configuration of memory structure 200 (FIG. 2A), the BLs and common SL, 204 to 208, are coupled to (e.g., used by) four HE memory cells, which include the HE memory cells 200a and 200b and two other HE memory cells (not shown) formed by the others of the gate electrode 202, memory layer 203, and semiconductor channel 210. By contrast, in the configuration of memory structure 260 (FIG. 2B), the BLs and common SL, 204 to 208, may not be coupled to (e.g., used by) HE memory cells other than 200a and 200b.

FIG. 3A illustrates a cross-sectional view of an example memory structure 300 of a number of the disclosed 2-bit memory cells (e.g., 104c, 114c of FIGS. 1A-B), in accordance with some embodiments.

The memory structure 300 includes a pair of gate electrodes (or gate stacks) 302, a pair of memory layers 303, a pair of semiconductor channels 310 on each side of the memory structure 300. Each of the gate electrodes 302 is disposed on one of the sides of the memory structure 300; each of the memory layers 303 is disposed on one of the sides of the memory structure 300; and each of the semiconductor channels 310 is disposed on one of the sides of the memory structure 300, as illustrated in FIG. 3A. Further, the memory structure 300 includes BL 304 and SL 306 interposed between (e.g., coupled to) such pairs of gate electrodes 302, memory layers 303, and semiconductor channels 310. The BL 304 and SL 306 can be electrically isolated from each other by an isolation region 312. Each of the gate electrode 302, memory layers 303, semiconductor channels 310, BL 304, and SL 306 is formed as a upright structure that extends along a vertical direction, which will be discussed in further detail below.

In some embodiments, a first portion of one of the semiconductor channels 310, a first portion of one of the memory layers 303, and a first portion of one of the gate electrodes 302 can at least form a first 2-bit memory cells 300a; and a second portion of one of the semiconductor channels 310, a second portion of one of the memory layers 303, and a second portion of one of the gate electrodes 302 can at least partially form a second 2-bit memory cell 300b, as illustrated in FIG. 3A. The semiconductor channel 310 can include a first S/D region 310a and a second S/D region 310b, where the first S/D region 310a is coupled to the BL 304 and the second S/D region 310b is coupled to the SL 306. Although a certain number of structures are shown for simplicity and clarity, and embodiments are not limited thereto. Furthermore, the shapes and sizes of the structures are not necessarily drawn to scale. Although this disclosure includes a detailed description of a ferroelectric transistor for the 2-bit memory cell, embodiments are not limited thereto, and any non-volatile 3D memory is within the scope of disclosure. Furthermore, although the 2-bit memory cell 300a is primarily described, similar descriptions apply to the 2-bit memory cell 300b.

Dipoles are dispersed throughout the memory layer 303. In particular, memory layer 303 includes a first set of dipoles 314a at the second end of the memory layer 303, and a second set of dipoles 314b at the first end of the memory layer 303. The first set of dipoles 314a has a first polarization. The second set of dipoles 314b has a second polarization where the second polarization is substantially opposite the first polarization. Each dipole 314a and each dipole 314b is correspondingly represented in FIG. 3A by an arrow. As used herein, the arrow head of the dipole represents a positively charged end of the dipole and the tail represents a negatively charged end of the dipole. Accordingly, each dipole 314a and each dipole 314b correspondingly represents separation of positive and negative charges, and vice-versa, within the memory layer 303. For simplicity of illustration, two dipoles 314a and two dipoles 314b are shown in FIG. 3A; as a practical matter, a great many dipoles present in the memory layer 303 and which have correspondingly the orientations of dipole 314a or 314b.

In FIG. 3A, regarding a first dipole which has the positively charged end pointing upward and the negatively charged end pointing downward, the following is assumed: the first dipole represents a first polarization state; the first dipole, e.g., dipole 314a, is shown as an arrow whose head is pointing upward and whose tail is pointing downward; and the first dipole represents a logic 0. Also in FIG. 3A, regarding a second dipole which has the negatively charged end pointing upward and the positively charged end pointing downward, the following is assumed: the second dipole represents a second polarization state; the second dipole, e.g., dipole 314b, is shown as an arrow whose tail is pointing upward and whose head is pointing downward; and the second dipole represents a logic 1. Accordingly, in FIG. 3A, relative to the X-direction, the polarization of the memory layer 303 is asymmetric. For example, the polarization of the memory layer 303 is asymmetric because the first end of the memory layer 303 (which is proximal to the first S/D region 310a) has the second polarization and the second end of the memory layer 303 (which is proximal to the second S/D region 310b) has the first polarization.

In one or more embodiments, an invertible region 316 extends through the semiconductor channel 310 between the first S/D region 310a and the second S/D region 310b. In some embodiments, the semiconductor substrate has N-type doping such that the charge carriers are electrons (−) and 2-bit memory cell 300a is an N-type FeFET. In some embodiments, the N-type 2-bit memory cell 300a is described as an N-type Metal Oxide Semiconductor FET (MOSFET) which further includes a ferroelectric layer (e.g., memory layer 303) inserted between the gate electrode (e.g., gate electrode 302) and the invertible region (e.g., invertible region 316). In some embodiments, the semiconductor substrate has P-type doping such that the charge carriers are holes (+) and 2-bit memory cell 300a is a P-type FeFET. In some embodiments, the 2-bit memory cell 300a includes a metal ferroelectric insulator semiconductor (MFIS), a single cell transistor capable of holding an electrical field polarization to retain one or more steady states in the absence of any electrical bias or the like.

If memory layer 303 were not present, and in the absence of a voltage on gate electrode 302, invertible region 316 would represent a depletion region that does not support the flow of charge carriers. If memory layer 303 was not present, in the presence of a sufficient voltage on gate electrode 302, i.e., a voltage greater than the threshold voltage, Vt, invertible region 316 would be inverted and would support the flow of charge carriers and so would represent a channel extending from the first S/D region 310a to the second S/D region 310b.

If both overlying portions of the memory layer 303 have the first polarization state, and in the absence of voltages correspondingly on the gate electrode 302, the first S/D region 310a and the second S/D region 310b, then the corresponding portions of the invertible region 316 correspondingly are depletion regions that do not support the flow of charge carriers. However, if both overlying portions of the memory layer 303 have the second polarization state, and in the absence of voltages correspondingly on the gate electrode 302, the first S/D region 310a and the second S/D region 310b, then the corresponding portions of invertible region 316 do support the flow of charge carriers.

In FIG. 3A, a first portion of invertible region 316 is proximal to the first end of the memory layer 303 and to first S/D region 310a, and a second portion of invertible region 316 is proximal to the second end of the memory layer 303 and to the second S/D region 310b. In FIG. 3A, a channel band barrier (CBB) portion 318a is different than CBB portion 318b for the second portion of the invertible region 316. In some embodiments, the CBB represents the bottom edge of the depletion region within the invertible region 316, wherein the bottom edge of the depletion region is distal from the memory layer 303 and the top edge of the depletion region is proximal to the memory layer 303.

In one or more embodiments, the 2-bit memory cell 300a is configured to store one of four possible 2-bit data states, namely (0,1), (1,0), (1,1) or (0,0). In some embodiments, a bit represented by the polarization of the second end of the memory layer 303 proximal to the second S/D region 310b is referred to as the first bit or bit zero (b0) of the 2-bit memory structure which 2-bit memory cell 300a represents, and a bit represented by the polarization of the first end of the memory layer 303 proximal to the first S/D region 310a is referred to as the second bit or bit one (b1) of the 2-bit memory cell 300a. Accordingly, the two bits are representable as (b1,b0), where (b1,b0) is one of (0,1), (1,0), (1,1) or (0,0).

Relative to the X-direction, gate electrode 302 is shown between first and second S/D regions 310a and 310b. In some embodiments, the gate electrode 302 and the memory layer 303 partially abuts first S/D region 310a and/or second S/D region 310b. In some embodiments, the gate electrode 302 and the memory layer 303 cover substantially all of first S/D region 310a and/or the second S/D region 310b on one side in the Y-direction. In some embodiments, the first S/D region 310a has a first doping type and the second S/D region 310b has a second doping type that is opposite to the first doping type. In some embodiments, while having the same doping type, the first S/D region 310a has a different doping concentration than the second S/D region 310b. For example, in some embodiments, the first S/D region 310a has a lower doping concentration than second S/D region 310b. In some embodiments, the lower doping concentration of the first and second S/D regions 310a and 310b mitigates gate induced drain leakage (GIDL) current in FeFETs. In some embodiments, the semiconductor channel 310 is an opposite dopant type relative to a dopant type of the first and second S/D regions 310a and 310b. For example, if the first and second S/D regions 310a and 310b are n-type, then semiconductor channel 310 is p-type, and vice-versa.

In general, subjecting memory layer 303 to an electric field of sufficient magnitude orients dipoles in the memory layer 303 into a corresponding one of two possible polarization states (bistable states), e.g., dipole 314a and dipole 314b. The corresponding field-induced polarization state remains after the field is removed, i.e., each of the bistable polarization states is non-volatile. In terms of the FeFET as a whole, the two possible polarization states of the layer of ferroelectric material manifest as two corresponding possible states of the FeFET, namely an erased state and a programmed state.

In FIG. 3A, bit b1 of the 2-bits of data stored by the 2-bit memory cell 300b is shown as being a logic 1 and so is represented by the first end of memory layer 303 (which is proximal to the S/D region 310a) having the second polarization as represented by dipoles 314b; and bit b0 of the 2-bits of data stored by 2-bit memory cell 300a is shown as being a logic 0 and so is represented by the second end of memory layer 303 (which, again, is proximal to the S/D region 310b) having the first polarization as represented by dipoles 314a.

In some embodiments, setting a bit to a logic 1, i.e., programming the bit, in 2-bit memory cell 300a is performed by applying an appropriate value of a gate voltage (Vg) and applying a corresponding appropriate value of a source/drain voltage (Vs/d) to the selected one of the first or second S/D region 310a or 310b that is to be set to a logic 1. For example, Vs/d is applied to the first S/D region 310a (through BL 304) and/or the second S/D region 310b (through SL 306) based upon which one of the four 2-bit data states is to be stored in the 2-bit memory cell 300a, where the 2-bits (b1,b0) have the state (0,1), (1,0), (1,1) or (0,0). In some embodiments, both of bits b1 and b0 are set to logic 1, i.e., programmed, in the 2-bit memory cell 300a using Vg of about 3V and using Vs/d of about 0V for each of first S/D region 310a and second S/D region 310b. In some embodiments, to program one of bits b1 and b0, e.g., bit b0, Vg is set to about 3V, the second S/D region 310b is about 0V, while the first S/D region 310a is left floating or receives about 1V.

In some embodiments, both of bits b1 and b0 are set to logic 0, i.e., erased, in 2-bit memory cell 300a using Vg of about −2V and using Vs/d of about 1V for each of the first S/D region 310a and the second S/D region 310b. In some embodiments, to erase one of bits b1 and b0, e.g., bit b0, Vg is set to of about −2V, second S/D region 310b is about 1V, while first S/D region 310a is left floating or receives of about 0V.

In general, to change the polarization state of a portion of a ferroelectric layer, the portion of the ferroelectric layer is subjected to an electric field of sufficient magnitude to orient the dipoles of the portion of the ferroelectric layer which are in the path of the electric field according to the direction of the electric field. In some embodiments, an electric field of sufficient magnitude to orient the dipoles of the ferroelectric layer is referred to as a coercive field (Ec). In some embodiments, and in the context of the 2-bit memory cell 300a, a voltage difference between Vg and Vs/d which is of sufficient magnitude to induce Ec is referred to as a coercive voltage (Vc). In some embodiments, Vc is at least about 3V.

For example, to manipulate the polarization of dipoles 314a so that bit b0 represents a logic 1, a combination of voltage values for Vg and Vs/d (applied to the second S/D region 310b) (Vsd_310b) is applied wherein the resulting difference is equal to or greater than Vc. In some embodiments, to change the polarization of dipoles 314a so as to represent a logic 0, a combination of Vg of about −2V and Vsd_310b of about 1V is used. In a circumstance in which second S/D region 310b has a higher positive potential than gate electrode 302, (e.g., Vg of about −2V and Vsd_310b of about 1V), dipoles 314a become orientated with the negative ends proximal to second S/D region 310b and the positive ends proximal to gate electrode 302, resulting in the negative ends being proximal to invertible region 316. To avoid altering the state of bit b1 which is represented by the polarization of dipoles 314b, e.g., while the polarization of dipoles 314a is being manipulated, a voltage value of Vs/d that is applied to first S/D region 310a (Vsd_310a) is selected so that a combination of voltage values for Vg and Vsd_310a results in a voltage difference that is less than Vc and thus dipoles 314b at first S/D region 310a are not altered from their previous state. In some embodiments, to avoid altering the state of bit b1 while the polarization of dipoles 314a is being manipulated (in part by setting Vg of about −2V), first S/D region 310a is left floating. In some embodiments, to avoid altering the state of bit b1 while the polarization of dipoles 314a is being manipulated (in part by setting Vg of about −2V), Vsd_310a of about 0V. In some embodiments, to avoid altering the state of bit b1 while the polarization of dipoles 314a is being manipulated (in part by setting Vg of about −2V), Vsd_310a of VSS.

The polarization of the second end of memory layer 303, which is proximal to second S/D region 310b, thickens the depletion region proximal to second S/D region 310b relative to the Y-direction, and correspondingly raises/increases CBB portion 318b proximal to second S/D region 310b. This raising/increasing of CBB portion 318b is discussed in more detail below.

FIGS. 3B-3D illustrate waveforms that illustrate a read operation for the 2-bit memory cell 300a, in accordance with some embodiments. During phase 1 (see also FIG. 3C), the voltages are configured to read bit b1 of the 2-bit data stored by the 2-bit memory cell 300a, where bit b1 is stored at the first end of memory layer 303 which is proximal to the first S/D region 310a. A bias voltage (Vbias) is applied to the gate electrode 302, a read voltage (Vread) is applied to the second S/D region 310b, and a non-disturbing voltage (Vdnd) is applied to the first S/D region 310a. During phase 2, the voltages are configured to read bit b0, where bit b0 is stored at the second end of memory layer 303 which is proximal to the second S/D region 310b. During phase 2, bit b0 is read, wherein bit b0 is stored at the second end of memory layer 303, the second end being proximal to second S/D region 310b. During phase 2, Vg of Vbias is applied to gate electrode 302, Vdnd is applied to the second S/D region 310b and Vread is applied to the first S/D region 310a. Although FIGS. 3B-3D are described with an example of bit b1 having the logic 1 and bit b0 having the logic 0, embodiments are not limited thereto, and the bit b1 can have logic 1 or logic 0, and the bit b0 can have logic 1 or logic 0.

FIGS. 3B-3D illustrate waveforms 319, 320 and 328 that illustrate the operation of the 2-bit memory cell 300a, in accordance with some embodiments. The waveforms 319, 320 and 328 include channel band barrier portions 318a and 318b under correspondingly different conditions, in accordance with some embodiments.

In FIG. 3B, waveform 319 represents channel band barrier (CBB) portions 318a and 318b for the 2-bit memory cell 300a during quiescent conditions. In some embodiments, during quiescent conditions for the 2-bit memory cell 300a, each of gate electrode 302, first S/D region 310a and second S/D region 310b is left floating.

In waveform 319, CBB portion 318b has a first quiescent CBB value which corresponds to the first polarization state and so corresponds to a logic 0. Hereinafter, the first quiescent CBB value is referred to as QCBB0. In waveform 319, CBB portion 318a has a second quiescent CBB value which corresponds to the second polarization state and so corresponds to a logic 1. Hereinafter, the second quiescent CBB value is referred to as QCBB1.

In FIG. 3C, waveform 320 represents CBB portions 318a and 318b during phase 1 of the two-phase read operation. During phase 1, bit b1 is read, wherein bit b1 is stored at the first end of memory layer 303, the first end being proximal to first S/D region 310a. During phase 1, Vg of Vbias is applied to the gate electrode 302, Vdnd is applied to the first S/D region 310a and Vread is applied to the second S/D region 310b.

In FIG. 3D, waveform 328 represents CBB portions 318a and 318b during phase 2 of the two-phase read operation. During phase 2, bit b0 is read, wherein bit b0 is stored at the second end of memory layer 303, the second end being proximal to second S/D region 310b. During phase 2, Vg of Vbias is applied to gate electrode 302, Vdnd is applied to the second S/D region 310b and Vread is applied to the first S/D region 310a.

Regarding FIGS. 3C-3D, in effect, relative to the side of the 2-bit memory cell 300a for which the stored bit value is being read (read-side), Vread is applied to the opposite side of the 2-bit memory cell 300a (non-read-side), which might seem counterintuitive at first. However, the values for Vread and Vg of Vbias are configured to ensure that the portion of invertible region 316 on the non-read-side of the 2-bit memory cell 300a is manipulated to support temporarily a flow of charge carriers. In some embodiments, the temporary duration of the support corresponds to the period of time in which the values for Vread and Vg of Vbias are applied which ensure that the portion of invertible region 316 on the non-read-side of the 2-bit memory cell 300a supports a flow of charge carriers. By manipulating the non-read-side of the 2-bit memory cell 300a to support temporarily a flow of charge carriers, whether or not a current flows between S/D regions 310a and 310b is then controlled by whether or not the portion of invertible region 316 on the read-side of the 2-bit memory cell 300a supports the flow of charge carriers.

Recalling the particular circumstances in which the second end of memory layer 303 has the first polarization representing a logic 0 value, the portion of invertible region 316 under the second end of memory layer 303 has CBB portion 318b, and that CBB portion 318b accordingly has QCBB0, a value for Vg of Vbias is selected to be less than Vt for the particular circumstances. However, for the particular circumstances, the combination of Vg of Vbias and Vread is greater than Vt. Accordingly, in some embodiments, because Vg of Vbias is less than Vt for the particular circumstances, Vg of Vbias is described as sub-threshold voltage.

In general, assuming the non-read-side is being manipulated to support temporarily a flow of charge carriers, if the read-side of the 2-bit memory cell 300a stores a logic 0 because the read-side of memory layer 303 is in the first polarization state, then the portion of invertible region 316 on the read-side of the 2-bit memory cell 300a does not support the flow of charge carriers, resulting in substantially no current flowing between S/D regions 310a and 310b, which is interpreted as the read-side bit of the 2-bit memory cell 300a storing a logic 0.

Also, in general, assuming the non-read-side is being manipulated to support temporarily a flow of charge carriers, if the read-side of the 2-bit memory cell 300a stores a logic 1 because the read-side of memory layer 303 is in the second polarization state, then the portion of invertible region 316 on the read-side of the 2-bit memory cell 300a does support the flow of charge carriers, resulting in a significant flow of current between S/D regions 310a and 310b, which is interpreted as the read-side of the 2-bit memory cell 300a storing a logic 1. In some embodiments, a significant flow current is a current flow that would not be regarded as merely a leakage current.

Regarding FIG. 3C, recalling that bit b1 is logic 1 because the first end of memory layer 303 has the second polarization and that bit b0 of logic 0 because the second end of memory layer 303 has the first polarization, FIG. 3C assumes that Vg having Vbias is being applied to gate electrode 302, Vdnd of about 0V is being applied to first S/D region 310a, and Vread of about −1V is being applied to second S/D region 310b.

In the context of FIG. 3C, the voltage difference between Vg of Vbias and Vread (the latter being applied to second S/D region 310b) in combination with the first polarization state of the second end of memory layer 303 is sufficient to overcome the first polarization at the second end of memory layer 303 and consequently is sufficient to draw charge carriers into the portion of invertible region 316 that is proximal to second S/D region 310b, with a result that the portion of invertible region 316 which is proximal to first S/D region 310a supports temporarily a flow of charge carriers. Because of the second polarization at the first end of memory layer 303, the portion of invertible region 316 proximal to first S/D region 310a supports the flow of charge carriers under quiescent conditions. Accordingly, the portion of invertible region 316 proximal to first S/D region 310a also supports the flow of charge carriers when Vg of Vbias is being applied to gate electrode 302 and Vdnd of about 0V is being applied to first S/D region 310a. As a temporary result, both the portion of invertible region 316 proximal to first S/D region 310a and the portion of invertible region 316 proximal to second S/D region 310b support the flow of charge carriers, and consequently current flows from first S/D region 310a to second S/D region 310b as indicated by reference number 330 in FIG. 3C, which is interpreted as the bit b1 of the 2-bit memory cell 300a storing a logic 1.

Regarding FIG. 3D, recalling that bit b1 has the logic 1 because the first end of memory layer 303 has the second polarization and that bit b0 has logic 0 because the second end of memory layer 303 has the first polarization, FIG. 3D assumes that Vg of Vbias is being applied to the gate electrode 302, Vread of about −1V is being applied to the first S/D region 310a, and Vdnd of about 0V is being applied to the second S/D region 310b.

In the context of FIG. 3D, because of the second polarization at the first end of memory layer 303, the portion of invertible region 316 proximal to S/D region 310a supports the flow of charge carriers under quiescent conditions. Accordingly, the portion of invertible region 316 proximal to S/D region 310a also supports the flow of charge carriers when Vg of Vbias is being applied to gate electrode 302 and Vread of about −1V is being applied to the first S/D region 310a. The voltage difference between Vg and Vdnd (the latter being applied to the second S/D region 310b) in combination with the second polarization state of the first end of memory layer 303 is not sufficient to overcome the first polarization at the second end of memory layer 303 and consequently is not sufficient to draw charge carriers into the portion of invertible region 316 that is proximal to second S/D region 310b, with a result that the portion of invertible region 316 which is proximal to first S/D region 310a does not support a flow of charge carriers. As a further result, only the portion of invertible region 316 proximal to first S/D region 310a supports the flow of charge carriers, and consequently no current flows from first S/D region 310a to second S/D region 310b as indicated by reference number 329 in FIG. 3D, which is interpreted as the bit b0 of the 2-bit memory cell 300a storing a logic 0.

Figure 4:
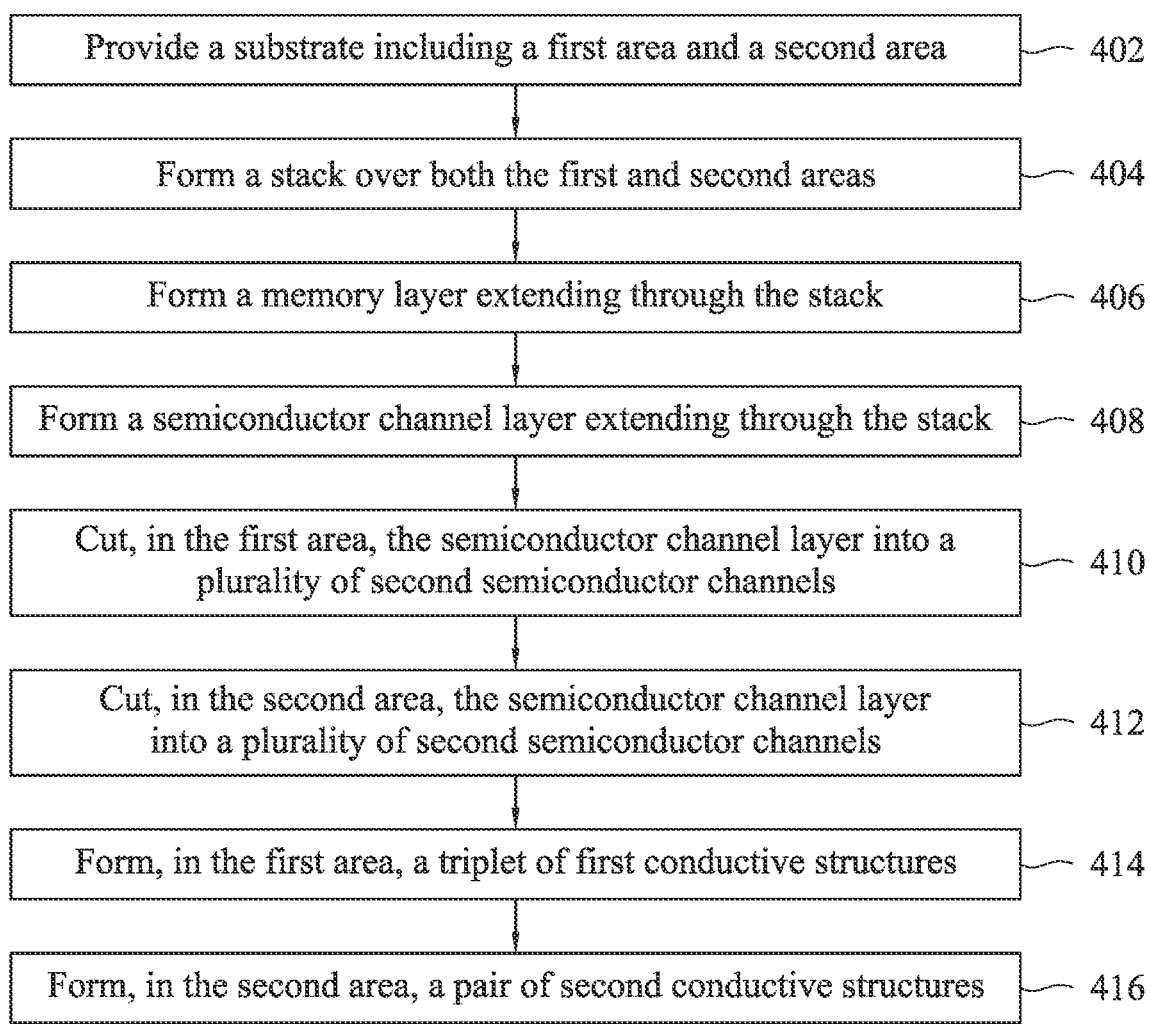
FIG. 4 illustrates a flow chart of an example processing of manufacturing a 3D memory device, in accordance with some embodiments.

FIG. 4 illustrates a flow chart of an example process 400 of manufacturing a memory device, in accordance with some embodiments. For example, at least some of the operations (or steps) of the process 400 can be used to form a 3D memory device. It is noted that the process 400 is merely an example, and is not intended to limit the present disclosure. Accordingly, it is understood that additional operations may be provided before, during, and after the process 400 of FIG. 4, and that some other operations may only be briefly described herein. In some embodiments, operations of the process 400 may be associated with perspective and/or top views of an example 3D memory device at various fabrication stages as shown in FIGS. 5A-5M, respectively, which will be discussed in further detail below.

In brief overview, the process 400 starts with operation 402 of providing a substrate including a first area and a second area. The process 400 continues to operation 404 of providing a stack of insulating layers and sacrificial layers over both the first and second areas. The process 400 continues to operation 406 of forming a memory layer extending through the stack. The process 400 continues to operation 408 of forming a semiconductor channel layer extending through the stack. The process 400 continues to operation 410 of cutting, in the first area, the semiconductor channel layer into a plurality of second semiconductor channels. The process 400 continues to operation 412 of cutting, in the second area, the semiconductor channel into a plurality of second semiconductor channels. The process 400 continues to operation 414 of forming, in the first area, a triplet of first conductive structures. The process 400 continues to operation 416 of forming, in the second area, a pair of second conductive structures.

FIGS. 5A-5M each illustrates a perspective view of an example 3D memory device 500 during various fabrication stages, in accordance with some embodiments. Such a 3D memory device may include at least a first memory structure (device) that has one or more HE memory cells, and at least a second memory structure (device) that has one or more 2-bit memory cells. For example, FIGS. 5A-5I apply to the fabrication of both the memory structures 200 (e.g., FIG. 2A) and 300 (e.g., FIG. 3A); FIGS. 5J and 5L apply to the fabrication of the memory structure 200; and FIGS. 5K and 5M apply to the fabrication of the memory structure 300.

Figure 5A:
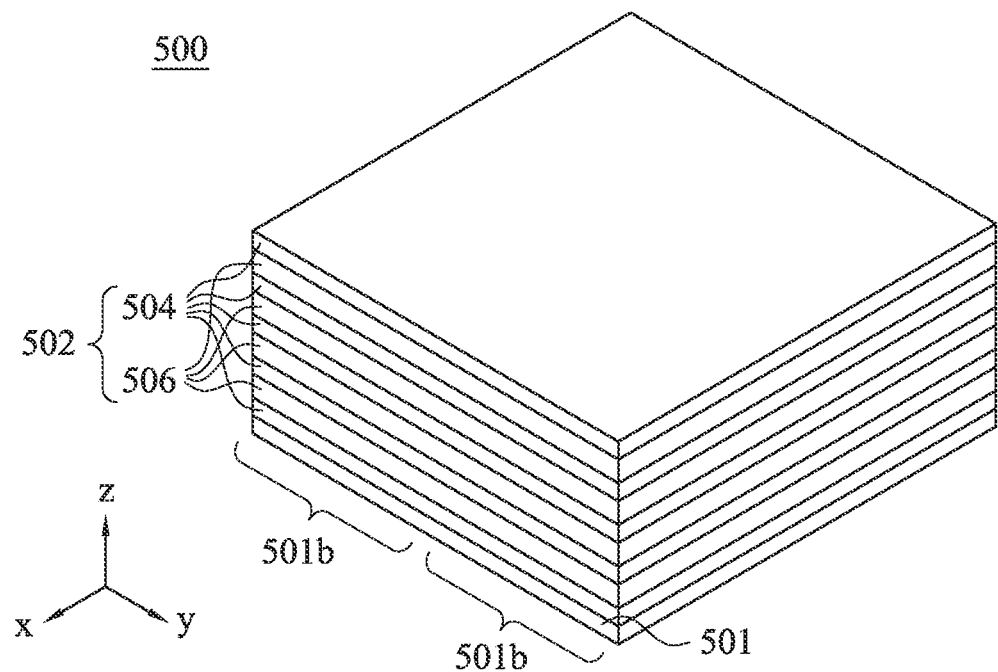
FIGS. 5A, 5B, 5C, 5D, 5E, 5F, 5G, 5H, 5I, 5J, 5K, 5L, and 5M each illustrates a perspective view of an example 3D memory device during various fabrication stages, in accordance with some embodiments.

Corresponding to operations 402 and 404 of FIG. 4, FIG. 5A is a perspective view of the 3D memory device 500 including a stack 502 formed over a semiconductor substrate 501 at one of the various stages of fabrication, in accordance with various embodiments.

The substrate 501 may be a semiconductor substrate, such as a bulk semiconductor, a semiconductor-on-insulator (SOI) substrate, or the like, which may be doped (e.g., with a p-type or an n-type dopant) or undoped. The substrate 501 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 501 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other materials are within the scope of the present disclosure.

The stack 502 includes a number of insulating layers 504 and a number of sacrificial layers 506 alternately stacked on top of one another over the substrate 501 along a vertical direction (e.g., the Z direction). Although five insulating layers 504 and four sacrificial layers 506 are shown in the illustrated embodiment of FIG. 5A, it should be understood that the stack 502 can include any number of insulating layers and any number of sacrificial layers alternately disposed on top of one another, while remaining within the scope of the present disclosure. Further, although the stack 502 directly contacts the substrate 501 in the illustrated embodiment of FIG. 5A, it should be understood that the stack 502 is separated from the substrate 501 (as mentioned above). For example, a number of (planar and/or non-planar) transistors may be formed over the substrate 501, and a number of metallization layers, each of which includes a number of contacts electrically connecting to those transistors, may be formed between the substrate 501 and the stack 502. As used herein, the alternately stacked insulating layers 504 and sacrificial layers 506 refer to each of the sacrificial layers 506 being adjoined by two adjacent insulating layers 504. The insulating layers 504 may have the same thickness thereamongst, or may have different thicknesses. The sacrificial layers 506 may have the same thickness thereamongst, or may have different thicknesses. In some embodiments, the stack 502 may begin with the insulating layer 504 (as shown in FIG. 5A) or the sacrificial layer 506.

The insulating layers 504 can include at least one insulating material. The insulating materials that can be employed for the insulating layer 504 include, but are not limited to, silicon oxide (including doped or undoped silicate glass), silicon nitride, silicon oxynitride, organosilicate glass (OSG), spin-on dielectric materials, dielectric metal oxides that are generally known as high dielectric constant (high-k) dielectric oxides (e.g., aluminum oxide, hafnium oxide, etc.) and silicates thereof, dielectric metal oxynitrides and silicates thereof, and organic insulating materials. Other materials are within the scope of the present disclosure. In one embodiment, the insulating layers 504 can be silicon oxide.

The sacrificial layers 506 may include an insulating material, a semiconductor material, or a conductive material. The material of the sacrificial layers 506 is a sacrificial material that can be subsequently removed selective to the material of the insulating layers 504. Non-limiting examples of the sacrificial layers 506 include silicon nitride, an amorphous semiconductor material (such as amorphous silicon), and a polycrystalline semiconductor material (such as polysilicon). In one embodiment, the sacrificial layers 506 can be spacer material layers that include silicon nitride or a semiconductor material including at least one of silicon or germanium. Other materials are within the scope of the present disclosure.

The stack 502 can be formed by alternately depositing the respective materials of the insulating layers 504 and sacrificial layers 506 over the substrate 501. In some embodiments, one of the insulating layers 504 can be deposited, for example, by chemical vapor deposition (CVD), followed by depositing, for example, using CVD or atomic layer deposition (ALD), one of the sacrificial layers 506. Other methods of forming the stack 502 are within the scope of the present disclosure.

Although the stack 502 is formed as being in contact with the substrate 501, which is implemented as a semiconductor wafer, in the illustrated embodiment of FIG. 5A (and the following figures), it should be appreciated that a number of layers can be formed between such a semiconductor substrate 501 and the stack 502. For example, a number of metallization layers, each of which includes a number of interconnect structure therein, can be disposed between the substrate 501 and the stack 502, while remaining within the scope of present disclosure. In some other embodiments where the stack 502 is in direct contact with the substrate 501, such a substrate 501, formed of a dielectric material (e.g., silicon nitride), may serve an etch stop layer for forming a number of conductive structures (e.g., SLs, BLs) extending through the stack 502.

Referring still to FIG. 5A, the substrate 501 can include at least a first area 501a and a second area 501b. In some embodiments, in the first area 501a, a first memory structure (device) having a number of HE memory cells are formed; and in the second area 501b, a second memory structure (device) having a number of 2-bit memory cells are formed. As mentioned above, some of the features/components of the memory device 500 can be concurrently formed in the first and second areas (for the first and second memory structures, respectively), and thus, such features are together discussed up to FIG. 5I Beyond FIG. 5I, FIGS. 5J and 5L are directed to discussion of the first memory structure in the first area 501a; and FIGS. 5K and 5M are directed to discussion of the second memory structure in the second area 501b.

Further, in the example of FIG. 5A, the areas 501a and 501b are disposed next to each other along the Y-direction, which is similar to the example of FIG. 1A. Thus, it should be understood that such two areas may be disposed next to each other along the X-direction, while remaining within the scope of present disclosure.

Figure 5B:
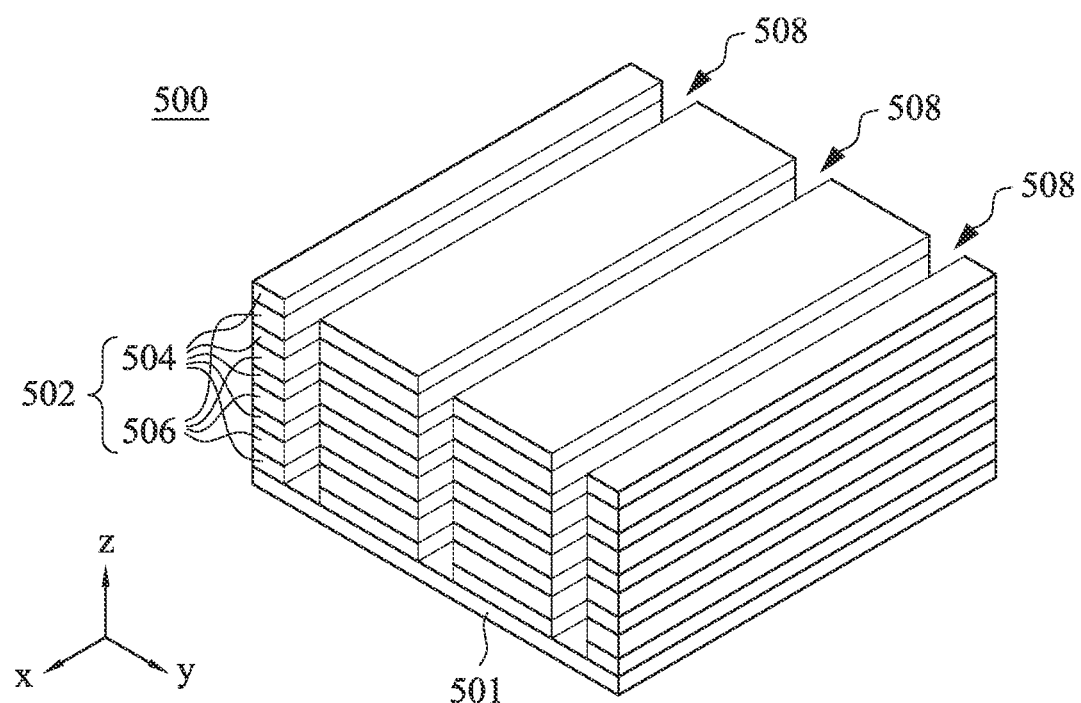

FIG. 5B is a perspective view of the memory device 500 after a plurality of first trenches 508 extending in the X-direction have been formed through the stack 502 by etching the stack 502 in the z-direction at one of the various stages of fabrication, in accordance with various embodiments. A plurality of first trenches 508 are formed through the stack in the first direction (e.g., the X-direction). The first trenches 508 have been formed through the stack 502 up to the substrate 501 by etching the stack 502 in the Z-direction. The etching process for forming the plurality of first trenches 508 may include a plasma etching process, which can have a certain amount of anisotropic characteristic. For example, the first trenches 508 may be formed, for example, by depositing a photoresist or other masking layer on a top surface of the memory device 500, i.e., the top surface of the topmost insulating layer 504 of the stack 502, and a pattern corresponding to the first trenches 508 defined in the masking layer (e.g., via photolithography, e-beam lithography, or any other suitable lithographic process). In other embodiments, a hard mask may be used.

Subsequently, the stack 508 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the first trenches 508. As a non-limiting example, a source power of about 10 Watts to about 3,000 Watts, a bias power of about 0 watts to about 3,000 watts, a pressure of about 1 millitorr to about 5 torr, and an etch gas flow of about 0 sccm to about 5,000 sccm may be used in the etching process. However, it is noted that source powers, bias powers, pressures, and flow rates outside of these ranges are also contemplated. As shown in FIG. 5B, the etch used to form the plurality of first trenches 508 etches through each of the sacrificial layers 506 and insulating layers 504 of the stack 502 such that each of the plurality of first trenches 508 extend form the topmost insulating layer 504 through the bottommost insulating layer 504 to the substrate 501.

Figure 5C:
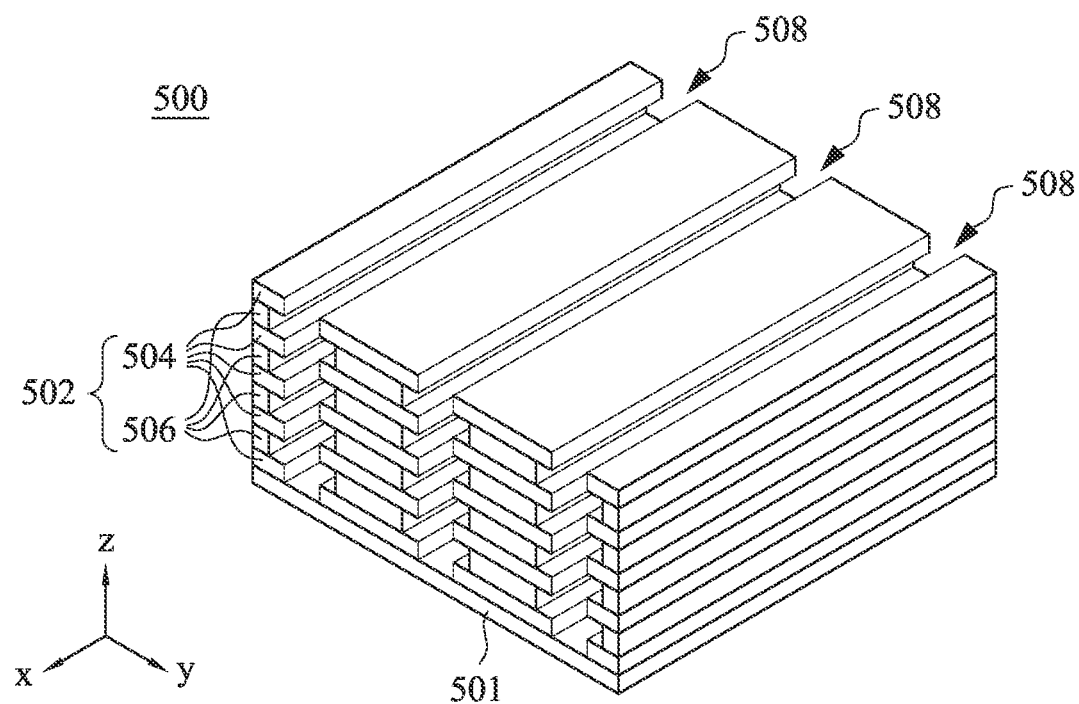

FIG. 5C is a top, perspective view of the memory device 500 after partially etching exposed surfaces of the sacrificial layers 506 that are located in the first trenches 508 at one of the various stages of fabrication, in accordance with some embodiments. For example, the exposed surfaces extend in the X-direction and etching the exposed surfaces of the sacrificial layers 506 reduces a width of the insulating layers 504 on either side of the sacrificial layers 506 in the Y-direction. In some embodiments, the sacrificial layers 506 may be etched using a wet etch process (e.g., hydrofluoric etch, buffered hydrofluoric acid). In other embodiments, the exposed surfaces of the sacrificial layers 506 may be partially etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of about 10 Watts to about 3,000 Watts, a bias power of about 0 watts to about 3,000 watts, a pressure of about 1 millitorr to about 5 torr, and an etch gas flow of about 0 sccm to about 5,000 sccm may be used in the etching process. However, it is noted that source powers, bias powers, pressures, and flow rates outside of these ranges are also contemplated. Partially etching the sacrificial layers in the Y-direction reduces a width of the sacrificial layers 506 relative to the insulating layers 504 disposed in the stack 502.

Figure 5D:
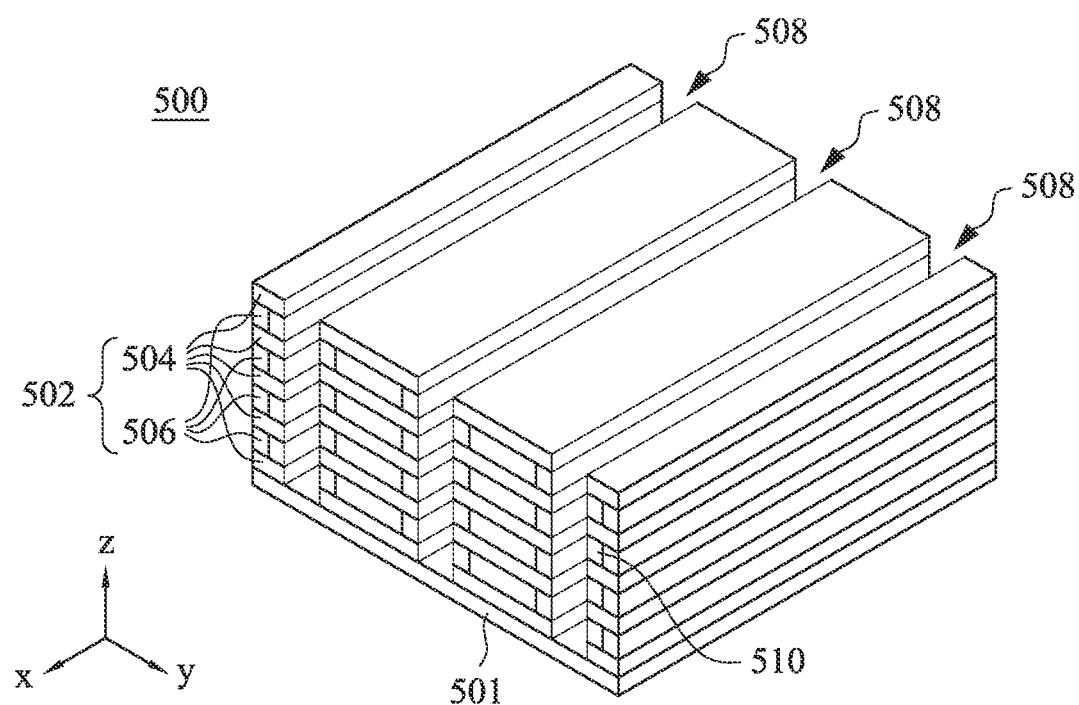

FIG. 5D is a perspective view of the memory device 500 after forming the gate layers (e.g., gate electrode, gate structure) 510 located in the first trenches 508 at one of the various stages of fabrication, in accordance with some embodiments. In various embodiments, an adhesive layer is deposited in the cavities formed by the etched sacrificial layers 506. The adhesive layer may include a material that has good adhesion with each of the insulating layers 504, the sacrificial layers 506, and the gate layer 510, for example, Ti, Cr, etc. The adhesive layers may be deposited using any suitable method including, for example, molecular beam deposition (MBD), atomic layer deposition (ALD), PECVD, and the like. In some embodiments, the adhesive layer may have a thickness in a range of about 0.1 nm to about 5 nm, inclusive.

In various embodiments, the gate layers 510 are formed by filling a gate dielectric and/or gate metal in the cavities over the adhesive layer, such that the gate layers 510 inherit the dimensions and profiles of the cavities. In various embodiments, the gate layers 510 may be formed from a high-k dielectric material. Although, each of gate layer 510 shown in FIG. 5D is shown as a single layer, in other embodiments, the gate layer 510 can be formed as a multi-layer stack (e.g., including a gate dielectric layer and a gate metal layer), while remaining within the scope of the present disclosure. The gate layers 510 may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate layers 510 can be deposited using any suitable method, including, for example, molecular beam deposition (MBD), atomic layer deposition (ALD), PECVD, and the like.

The gate metal may include a stack of multiple metal materials. For example, the gate metal may be a p-type work function layer, an n-type work function layer, multi-layers thereof, or combinations thereof. The work function layer may also be referred to as a work function metal. Example p-type work function metals may include TIN, TaN, Ru, Mo, Al, WN, $ZrSi_2$, $MoSi_2$, $TaSi_2$, $NiSi_2$, WN, other suitable p-type work function materials, or combinations thereof. Example n-type work function metals may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process.

Formation of the gate layers 510 in the cavities may cause radial edges of the gate layers 510 in the Y-direction to protrude radially outwards of the cavities, i.e., radially outwards of the corresponding edges of the insulating layers 504, and/or the material forming the gate layers 510 may also be deposited on exposed radial surfaces of the insulating layers 504 that face the first trenches 508 and/or the substrate 501. The protruding radial edges of the gate layers 510 and/or the extra deposited gate material are etched, for example, using a selective wet etching or dry etching process (e.g., RIE, DRIE, etc.) until any gate material deposited on the radial surfaces of the insulating layers 504 and/or the substrate 501, and radial edges of the gate layers 510 facing the first trenches 508 are substantially axially aligned with corresponding radial edges of the insulating layers 504.

Figure 5E:
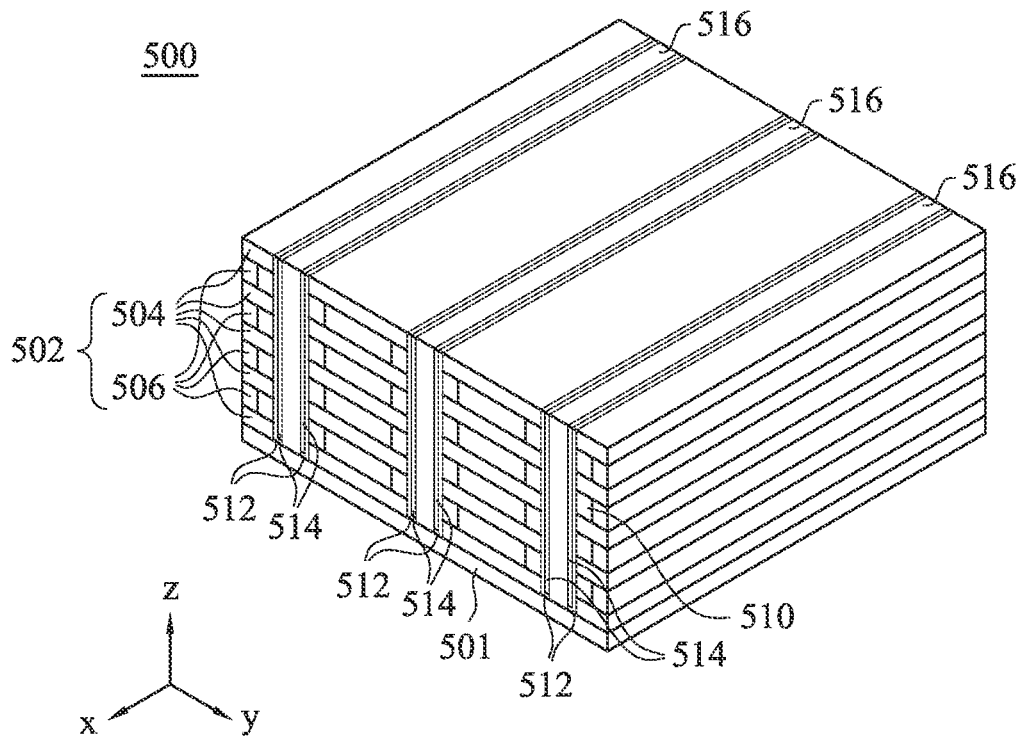

Corresponding to operations 406 and 408, FIG. 5E is a perspective view of the memory device 500 after formation of the memory layer (or memory layer) 512, a semiconductor channel layer 514, and an insulation layer 516. The memory layer 512 may include a ferroelectric material, for example, lead zirconate titanate (PZT), $PbZr/TiO_3$, $BaTiO_3$, $PbTiO_2$, etc. The memory layer 512 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the memory layer 512 is continuous on the walls of the first trenches 508.

The semiconductor channel layer 514 is formed on a radially inner surface of the memory layer 512 in the Y-direction. In some embodiments, the semiconductor channel layer 514 may be formed from a semiconductor material, for example, Si (e.g., polysilicon or amorphous silicon), Ge, SiGe, silicon carbide (SiC), etc. The semiconductor channel layer 514 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the semiconductor channel layer 514 is continuous on the radially inner surface of the memory layer 512.

Each of the first trenches 508 is then filled with an insulating material (e.g., SiO, SiN, SiON, SiCN, SiC, SiOC, SiOCN, the like, or combinations thereof) so as to form the insulation layer 516. In some embodiments, the insulation layer 516 may be formed from the same material as the plurality of insulating layers 504 (e.g., $SiO_2$). The insulation layer 516 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof.

Figure 5F:
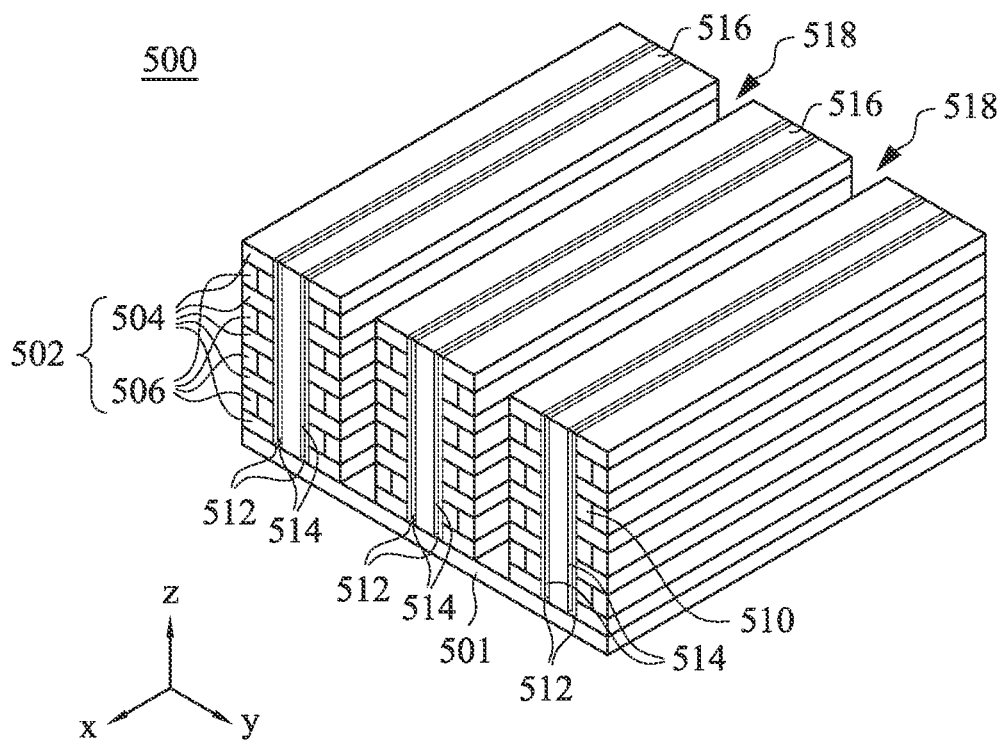

FIG. 5F is a perspective view of the memory device 500 after forming a plurality of second trenches 518 at one of the various stages of fabrication, in accordance with some embodiments. As with the first trenches 508, the second trenches 518 are formed by etching the stack 502 in the Z-direction up to the substrate 501.

The plurality of second trenches 518 may be formed using the same process used to form the plurality of first trenches 508. For example, the second trenches 518 may be formed, for example, by depositing a photoresist or other masking layer on a top surface of the memory device 500, i.e., the top surface of the topmost insulating layer 504 of the stack 502, and a pattern corresponding to the second trenches 518 defined in the masking layer (e.g., via photolithography, e-beam lithography, or any other suitable lithographic process). In other embodiments, a hard mask may be used. Subsequently, the second trenches 518 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the second trenches 518. As a non-limiting example, a source power of about 10 Watts to about 3,000 Watts, a bias power of about 0 watts to about 3,000 watts, a pressure of about 1 millitorr to about 5 torr, and an etch gas flow of about 0 sccm to about 5,000 sccm may be used in the etching process. However, it is noted that source powers, bias powers, pressures, and flow rates outside of these ranges are also contemplated. As shown in FIG. 5F, the etch used to form the plurality of second trenches 518 etches through each of the sacrificial layers 506 and insulating layers 504 of the stack 502 such that each of the plurality of second trenches 518 extend form the topmost insulating layer 504 through the bottommost insulating layer 504 to the substrate 501.

Figure 5G:
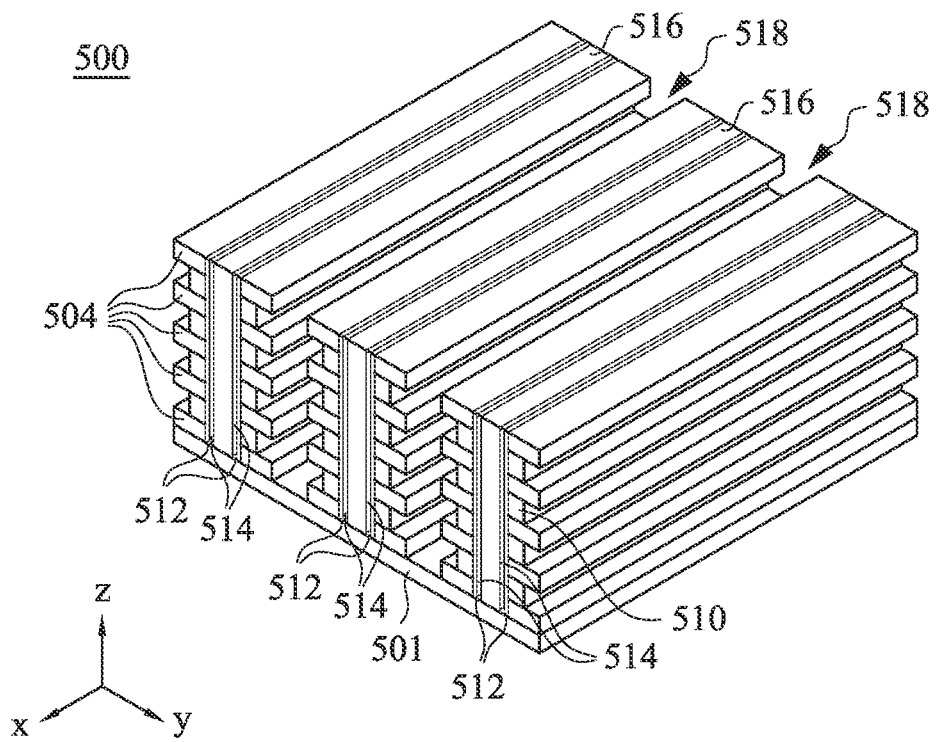

FIG. 5G is a perspective view of the memory device 500 after forming a second set of gate layers 510 adjacent to the previously formed gate layers 510 at one of the various stages of fabrication, in accordance with some embodiments. The remaining portions of the sacrificial layers 506 may be etched using the same process as described with respect to FIG. 5C, by etching exposed portions of the sacrificial layers 506 in the second set of trenches 518 until the sacrificial layers 506 are completely removed. This leaves cavities between adjacent layers of insulating layers 504, and adjacent to the gate layers. Adhesive layer is deposited on walls of the newly formed cavities.

Figure 5H:
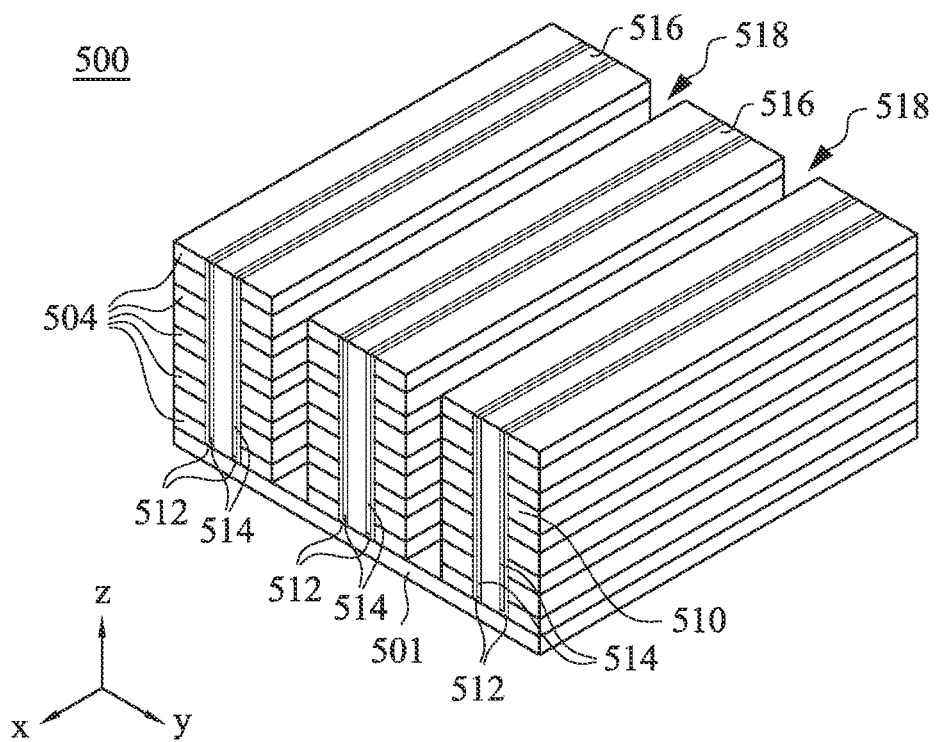
Figure 5I:
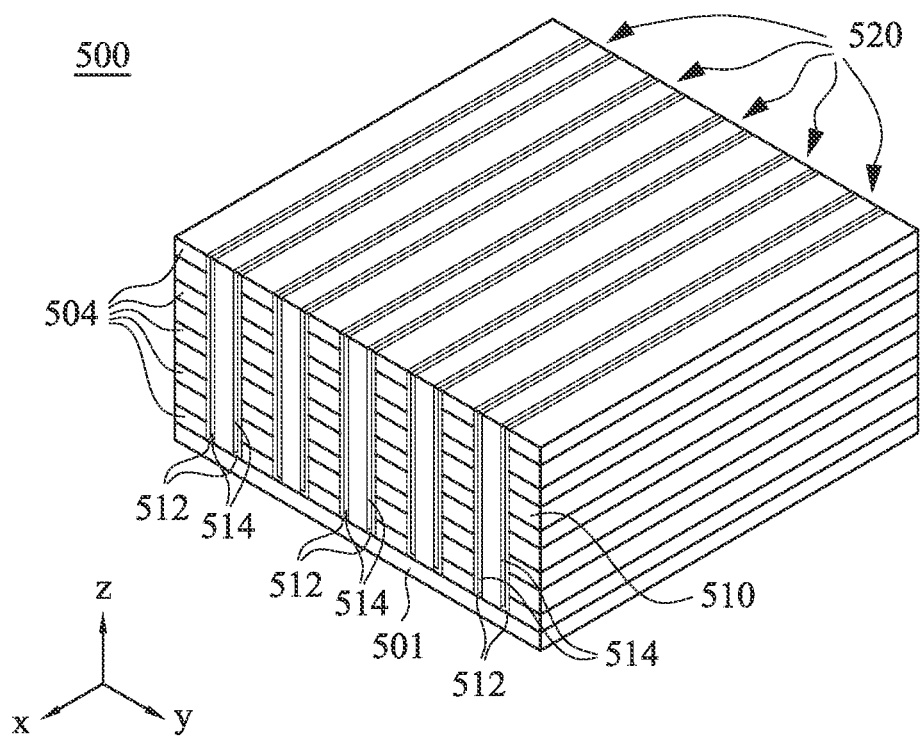
Figure 5J:
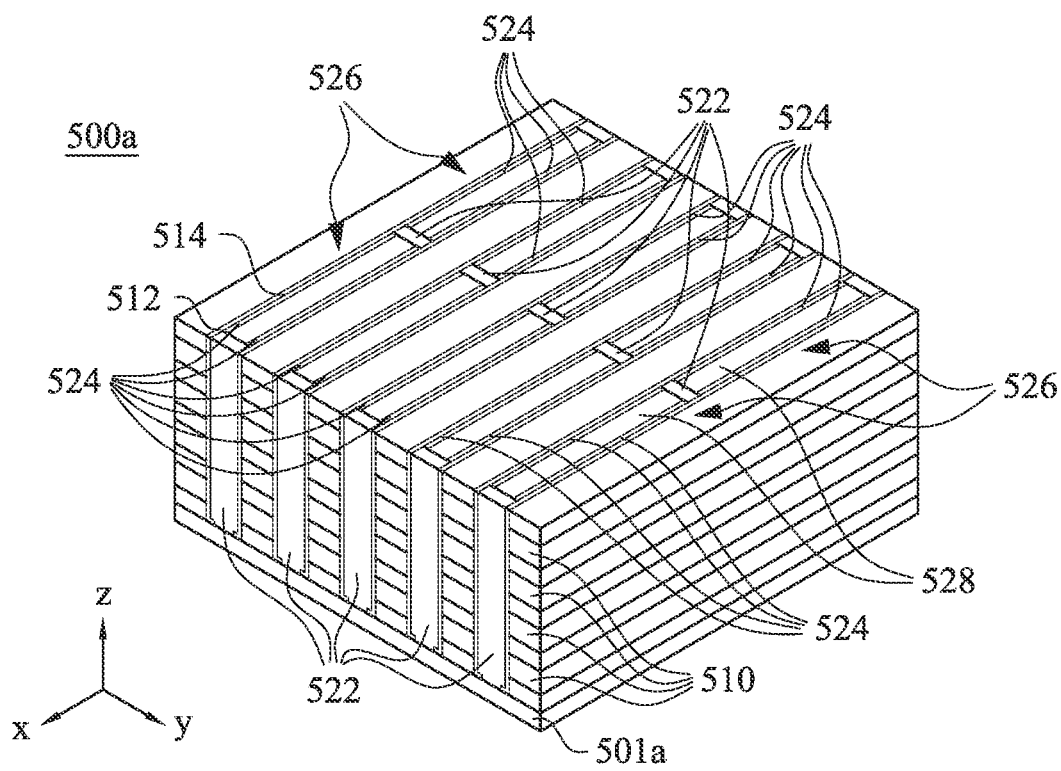
Figure 5K:
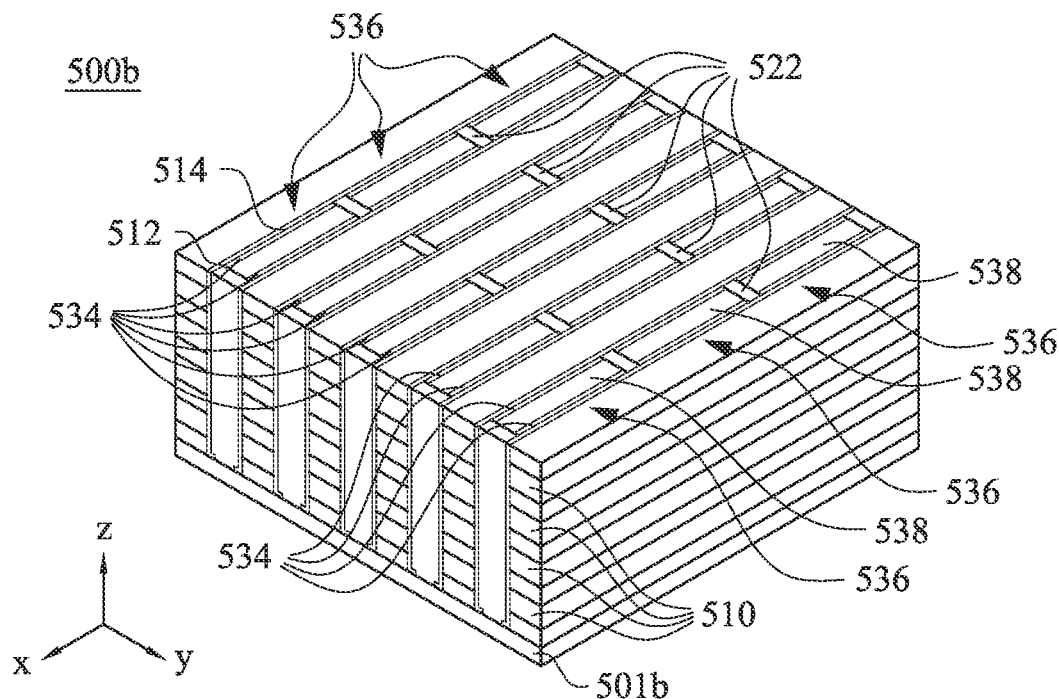
Figure 5L:
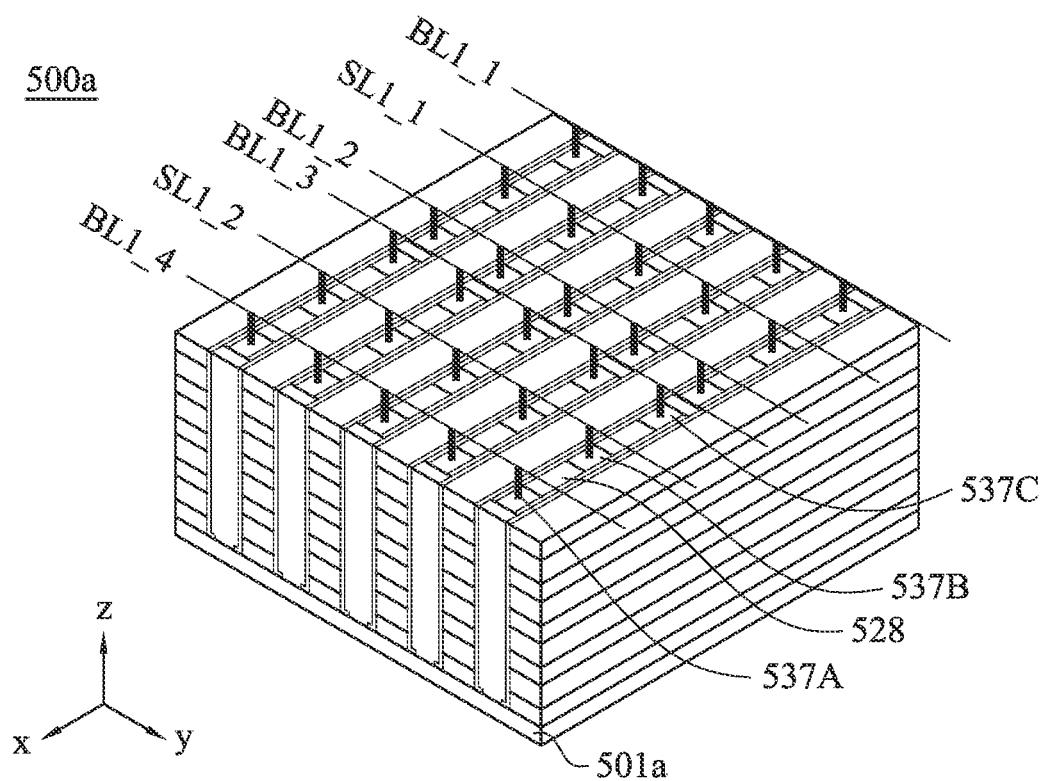
Figure 5M:
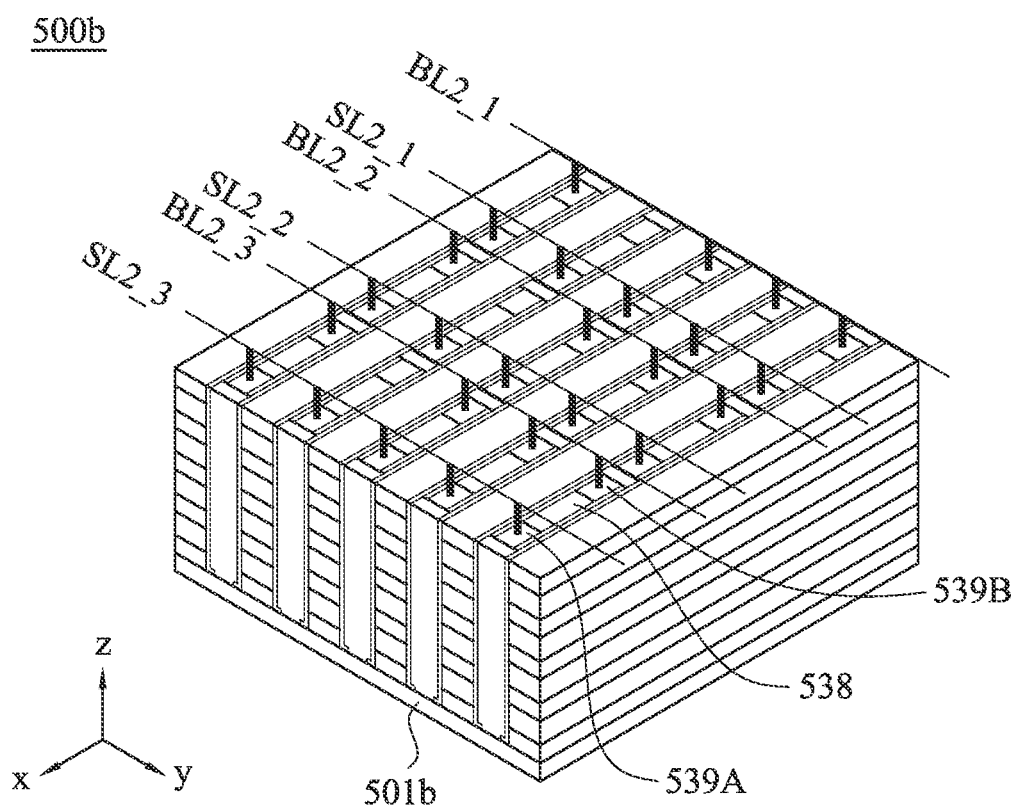

FIG. 5H is a perspective view of the memory device 500 after a gate layer material is deposited in the cavities so as to fill the cavities to form a second set of gate layers 510 adjacent to the previously formed gate layers 510 at one of the various stages of fabrication, in accordance with some embodiments. The two gate layers abut each other with the adhesive layer disposed therebetween (collectively called gate layer 510). The second set of gate layers 510 may be etched back such that radial edges of the second set of gate layers 510 facing the second trenches 518 are substantially axially aligned with corresponding radial edges of the insulating layers 504.

FIG. 5I is a perspective view of the memory device 500 after depositing additional memory layers 512, semiconductor channel layers 514, and insulation layers 516 at one of the various stages of fabrication, in accordance with some embodiments. The additional memory layers 512, semiconductor channel layers 514, and insulation layers 516 can be deposited in the same or similar way as described with respect to FIG. 5E. Accordingly, the memory device 500 includes 5 segments 520 of memory cells.

FIGS. 5J and 5L are described with respect to the fabrication of a first memory device portion 500a in the first area 501a of the substrate 501, and FIGS. 5K and 5M are described with respect to the fabrication of a second memory device portion 500b in the second area 501b of the substrate 501. The first memory device portion 500a and the second memory device portion 500b can be two different portions of the memory device 500. Memory structures in the first memory device portion 500a are similar to the memory structures 200 that includes a number of HE memory cells, and memory structures in the second memory device portion 500b are similar to the memory structures 300 that includes a number of 2-bit memory cells. Accordingly, both the HE memory cells (e.g., memory device 102c, 112c and memory structure 200) and the 2-bit memory cells (e.g., memory device 104c, 114c and memory structure 300) can be formed on the same semiconductor wafer or die.

Referring to operation 410, FIG. 5J is a perspective view of the first memory device portion 500a after the semiconductor channel layer 514 has been cut into a plurality of semiconductor channels (or semiconductor channel layers) 524 at one of the various stages of fabrication, in accordance with some embodiments. Referring to operation 412, FIG. 5K is a perspective view of the second memory device portion 500b after the semiconductor channel layer 514 has been cut into a plurality of semiconductor channels (or semiconductor channel layers) 534 at one of the various stages of fabrication, in accordance with some embodiments.

To form a plurality of memory structures 200 and a plurality of memory structures 300, a plurality of cavities are etched through the semiconductor channel layer 514 and the insulation layer 516 at predetermined space intervals. The space intervals for the memory structures 200 may be different from the space intervals for the memory structures 300. The cavities may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the cavities. As a non-limiting example, a source power of about 10 Watts to about 3,000 Watts, a bias power of about 0 watts to about 3,000 watts, a pressure of about 1 millitorr to about 5 torr, and an etch gas flow of about 0 sccm to about 5,000 sccm may be used in the etching process. However, it is noted that source powers, bias powers, pressures, and flow rates outside of these ranges are also contemplated.

The etched cavities are then filled with an insulating material (e.g., $SiO_2$) to form the isolation structures 522. The insulating material may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof. Etching the semiconductor channel layer 514 and the insulation layer 516 to form the isolation structures 522 separates the semiconductor channel layer 514 into portions such that a semiconductor channel 524 is included in each active device structure 526 (or memory structure 200) and a semiconductor channel 534 is included in each active device structure 536 (or memory structure 300).

Thus, as shown in each of FIG. 5J, each active device structure 526 includes an inner spacer 528 formed from a portion of the insulation layer 516 extending between adjacent isolation structures 522 in the X-direction. The semiconductor channel 524 is disposed on radially outer surfaces of the inner spacer 528 in the Y-direction, and the memory layer 512 is disposed on radially outer surfaces of the semiconductor channel 524 in the Y-direction. One or more gate layers 510 are in contact with radially outer surfaces of the memory layer 512, as previously described herein. As shown in each FIG. 5K, each active device structure 536 includes an inner spacer 538 formed from a portion of the insulation layer 516 extending between adjacent isolation structures 522 in the X-direction. The semiconductor channel 534 is disposed on radially outer surfaces of the inner spacer 538 in the Y-direction, and the memory layer 512 is disposed on radially outer surfaces of the semiconductor channel 534 in the Y-direction. One or more gate layers 510 are in contact with radially outer surfaces of the memory layer 512, as previously described herein.

One or more gate layers 510 are in contact with radially outer surfaces of the memory layer 512, as previously described herein. Each memory layer 512 and each gate layer 510 are continuous such that each memory layer 512 and at least one gate layer 510 (e.g., the bottommost gate layer 510 that is most proximate to the substrate 501) are shared by each active device structure 526 in a particular row of active device structures 526 and shared by each active device structure 536 in a particular row of active device structures 536.

In some embodiments, a length of each of the active device structure 536 (for the memory structure 300) can be shorter in the X-direction than a length of each active structure 526 (for the memory structure 200). However, embodiments are not limited thereto, and depending on the embodiments, the length of each of the active structure 536 may be the same length or longer in the X-direction than the length of each active structure 526.

Referring to operations 414 and 416, FIGS. 5L and 5M are perspective views of the first memory device portion 500a and second memory device portion 500b after a plurality of conductive structures have been formed at one of the various stages of fabrication, in accordance with some embodiments.

The conductive structures for the first memory device portion 500a, 537A, 537B, 357C, may be formed by first etching through axial ends and a middle portion of each of the inner spacers 528 to the substrate 501. The conductive structures 537A to 537C may be example implementations of the BL 208, SL 206, and BL 204 discussed with respect to FIG. 2A, respectively. The conductive structures for the second memory device portion 500b, 539A and 539B, may be formed by first etching through axial ends of each the inner spacers 538 to the substrate 501. The conductive structures 539A to 539B may be example implementations of the BL 304 and SL 306 discussed with respect to FIG. 3A, respectively.

The axial ends of the inner spacers 528 and 538, and the middle portion of the inner spacer 528, may be concurrently or respectively etched using a plasma etching process. For example, the axial ends and the middle portion of the inner spacers 528 may be first etched, followed by etching the axial ends of the inner spacers 538. The plasma etching process includes radical plasma etching, remote plasma etching, and other suitable plasma etching processes, RIE, DRIE, or the like. In the plasms etching process, gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of about 10 Watts to 3,000 Watts, a bias power of about 0 watts to about 3,000 watts, a pressure of about 1 millitorr to about 5 torr, and an etch gas flow of about 0 sccm to about 5,000 sccm may be used in the etching process. However, it is noted that source powers, bias powers, pressures, and flow rates outside of these ranges are also contemplated.

Next, the conductive structures 537A-C for the first memory device portions 500a and conductive structures 539A-B for the second memory device portion 500b may be formed, for example, using an epitaxial layer growth process. As shown in FIGS. 5L and 5M, the conductive structures 537A and 537C are located on opposite axial ends of the inner spacers 528, with the conductive structure 537B disposed in the middle portion of the inner spacer 528; and the conductive structures 539A and 539B are located on opposite axial ends of the inner spacers 538, with no conductive structure disposed therebetween.

In some embodiments, a control deposition step may be performed for forming the conductive structures, 537A-C and 539A-B, such that the deposition step is stopped when a height of the conductive structures in the Z-direction are about equal to a height of the stack 502. A CMP operation may be performed after the deposition step so as to ensure a top surface of each of the topmost insulating layer 504, the memory layer 512, the semiconductor channels 524 and 534, the inner spacers 528 and 538 (FIGS. 5J and 5K), and the conductive structures, 537A-C and 539A-B lie in the same X-Y plane or are level with a top surface of the topmost insulating layer 504.

In-situ doping (ISD) may be applied to form the conductive structures, 537A-C and 539A-B, thereby creating the junctions for each active memory device 526 and 536. N-type and p-type FETs are formed by implanting different types of dopants to selected regions (e.g., the source and drain regions) of the active device structures 526 and 536 to form the junction(s). N-type devices can be formed by implanting arsenic (As) or phosphorous (P), and p-type devices can be formed by implanting boron (B).

Vias are formed over the conductive structures, 537A-C and 539A-B, respectively. To form the vias, an array of cavities may be formed in the interlayer dielectric (not shown) to the underlying conductive structures, 537A-C and 539A-B. The cavities may be formed, for example, using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of about 10 Watts to about 3,000 Watts, a bias power of about 0 watts to about 3,000 watts, a pressure of about 1 millitorr to about 5 torr, and an etch gas flow of about 0 sccm to about 5,000 sccm may be used in the etching process. However, it is noted that source powers, bias powers, pressures, and flow rates outside of these ranges are also contemplated.

The array of cavities are then filled with an electrically conducting material, for example, tungsten (W), copper (Cu), cobalt (Co). etc., or a high-k dielectric material, for example, hafnium oxide (HfO), tantalum nitride (TaN), etc. The electrically conducting material may be deposited using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof.

A plurality of interconnect (e.g., metal) structures may be formed as signal lines over the vias in one of the various stages of fabrication, in accordance with some embodiments. Referring to FIG. 5L, a plurality of first signal lines (e.g., bit lines BL1_1, BL1_2, BL1_3, and BL1_4 and common source/select lines SL1_1 and SL1_2) are formed that each couple one of the conductive structures 537A-C to one another in the second direction (e.g., the Y-direction). The bit lines BL1_1, BL1_2, BL1_3, and BL1_4 are connected to a first bit line driver (not shown), and the common source/select lines SL1_1 and SL1_2 are connected to a first source/select line driver (not shown). Referring to FIG. 5M, a plurality of second signal lines (e.g., bit lines BL2_1, BL2_2, BL2_3 and source/select lines SL2_1, SL2_2, SL2_3) are formed that each couple one of the conductive structures 539A-B to one another in the Y-direction. The bit lines BL2_1, BL2_2, BL2_3 are connected to a second bit line driver (not shown), and the source/select lines SL2_1, SL2_2, SL2_3 are connected to a second source/select line driver (not shown). Although a certain number of bit lines and source/select lines are shown, embodiments are not limited thereto, and any number of bit lines and source/select lines are within the disclosure.

The signal lines may be formed from a conducting material, for example, tungsten (W), copper (Cu), cobalt (Co), etc. The signal lines may also be formed using a dual damascene process, for example, after formation of the through vias before removing the spacer layer. While the memory device 500 is shown without the spacer layer, in some embodiments, the spacer layer may remain included in the final memory device 500.

Figure 6A:
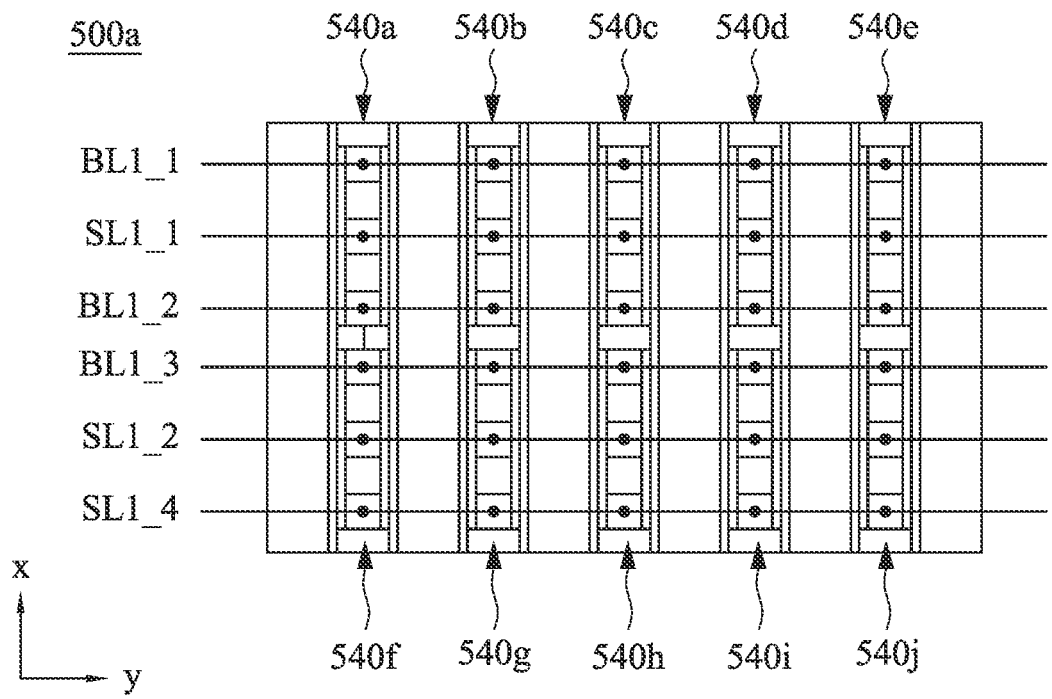
FIGS. 6A and 6B respectively illustrate top views of portions of a memory device, in accordance with some embodiments.

FIG. 6A illustrates a top view the first memory device portion 500a, in accordance with some embodiments. Bit lines BL1_1, BL1_2, BL1_3, and BL1_4 and the common source/select lines SL1_1 and SL1_2 are connected to a plurality of HE memory structures 540a, 540b, 540c, 540d, 540e, 540f, 540g, 540h, 540i, and 540j. Each of the HE memory structures of FIG. 6A is similar or the same as the memory structure 200 and may be controlled and operated as described above with reference to the memory structure 200.

The bit line BL1_1 is connected to the first S/D region of each of the HE memory structures 540a, 540b, 540c, 540d, and 540e. The common source SL1_1 is connected to the second S/D region of each of the HE memory structures 540a, 540b, 540c, 540d, and 540e. The bit line BL1_2 is connected to the third S/D region of each of the HE memory structures 540a, 540b, 540c, 540d, and 540e. The bit line BL1_3 is connected to the first S/D region of each of the HE memory structures 540f, 540g, 540h, 540i, and 540j. The common source SL1_2 is connected to the second S/D region of each of the HE memory structures 540f, 540g, 540h, 540i, and 540j. The bit line BL1_3 is connected to the third S/D region of each of the HE memory structures 540f, 540g, 540h, 540i, and 540j. Accordingly, the first bit line driver and the first common source/select line driver can control the HE memory structures 540a-540j using the bit lines BL1_1, BL1_2, BL1_3, and BL1_4 and the common source/select lines SL1_1 and SL1_2 with the word lines (not shown).

Figure 6B:
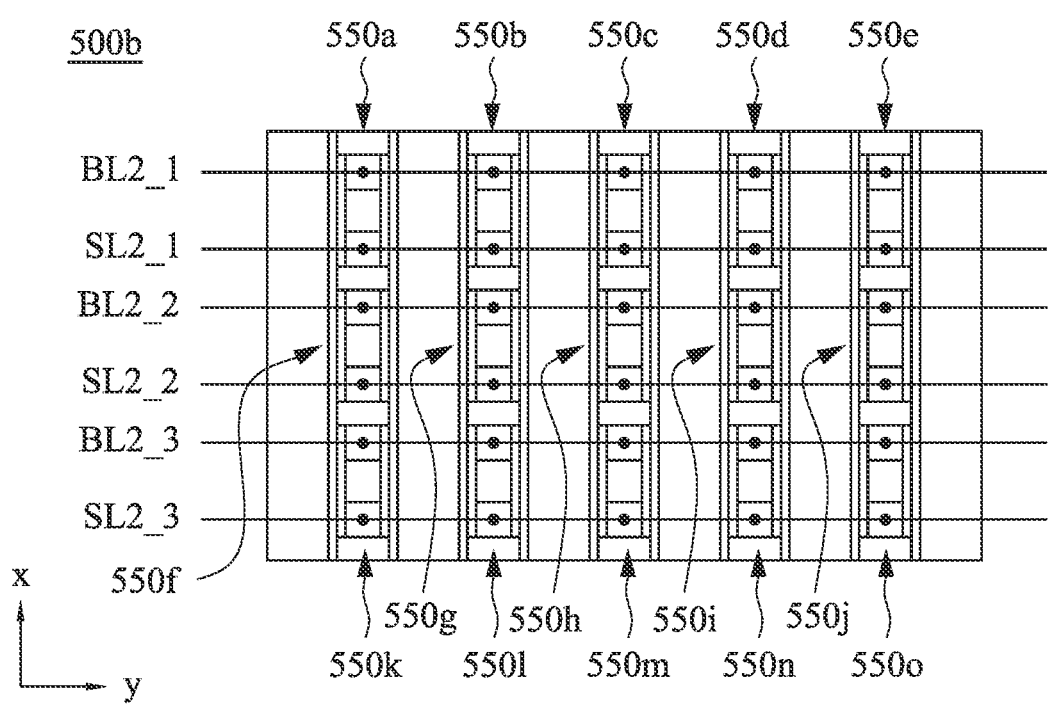

FIG. 6B shows a top view of the second memory device portion 500b, in accordance with some embodiments. FIG. 6B shows the bit lines BL2_1, BL2_2, BL2_3, and the source/select lines SL2_1, SL2_2, SL2_3 are connected to a plurality of 2-bit memory structures 550a, 550b, 550c, 550d, 550e, 550f, 550g, 550h, 550i, 550j, 550k, 550l, 550m, 550n, and 550o. Each of the 2-bit memory structures 550a-550o is similar or the same as the memory structure 300 and may be controlled and operated as described above with reference to the memory structure 300.

The bit line BL2_1 is connected to the first S/D region of each of the 2-bit memory structures 550a, 550b, 550c, 550d, and 550e. The bit line BL2_2 is connected to the first S/D region of each of the 2-bit memory structures 550f, 550g, 550h, 550i, and 550j. The bit line BL2_3 is connected to the first S/D region of each of the 2-bit memory structures 550k, 550l, 550m, 550n, and 550o. The source/select line SL2_1 is connected to the second S/D region of each of the 2-bit memory structures 550a, 550b, 550c, 550d, and 550e. The source/select line SL2_2 is connected to the second S/D region of each of the 2-bit memory structures 550f, 550g, 550h, 550i, and 550j. The source/select line SL2_3 is connected to the second S/D region of each of the 2-bit memory structures 550k, 550l, 550m, 550n, and 550o.

In one aspect of the present disclosure, a semiconductor device is disclosed. The semiconductor device includes a substrate including a first area and a second area. The semiconductor device in the first area includes a first memory layer extending along a vertical direction and a first semiconductor channel extending along the vertical direction and coupled to a portion of the first memory layer. The semiconductor device in the first area also includes first, second, and third conductive structures extending along the vertical direction. The first and third conductive structures are coupled to end portions of a sidewall of the first semiconductor channel, with the second conductive structure coupled to a middle portion of the sidewall of the first semiconductor channel. The semiconductor device in the second area includes a second memory layer extending along the vertical direction and a second semiconductor channel extending along the vertical direction and coupled to a first portion of the second memory layer. The semiconductor device in the second area includes fourth and fifth conductive structures extending along the vertical direction. The fourth and fifth conductive structures are coupled to end portions of a sidewall of the second semiconductor channel, with no vertically extending conductive structure interposed between the fourth and fifth conductive structures.

In another aspect of the present disclosure, a memory device is disclosed. The memory device includes a first memory array comprising a plurality of first memory cells and a second memory array comprising a plurality of second memory cells. The first and second memory arrays abut each other with an isolation structure interposed therebetween. The two adjacent ones of the plurality of first memory cells are operatively coupled to a common source line. Each of the plurality of second memory cells is operatively coupled to a respective single source line.

In yet another aspect of the present disclosure, a method for fabricating memory devices is disclosed. The method includes providing a substrate including a first area and a second area, forming a stack over both the first and second areas, the stack comprising a plurality of insulating layers and a plurality of sacrificial layers alternatively stacked on top of each other, and forming a memory layer extending through the stack, the memory layer extending along a vertical direction and a lateral direction. The method also includes forming a semiconductor channel layer extending through the stack, the semiconductor channel layer also extending along the vertical direction and the lateral direction. The method further includes cutting, in the first area, the semiconductor channel layer into a plurality of first semiconductor channels and cutting, in the second area, the semiconductor channel layer into a plurality of second semiconductor channels. The method also includes forming, in the first area, a triplet of first conductive structures extending in the vertical direction to be in contact with each of the plurality of first semiconductor channels and forming, in the second area, a pair of second conductive structures extending in the vertical direction to be in contact with each of the plurality of second semiconductor channels.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate including a first area and a second area;
   wherein the semiconductor device in the first area comprises:
   a first memory layer extending along a vertical direction;
   a first semiconductor channel extending along the vertical direction and coupled to a portion of the first memory layer;
   first, second, and third conductive structures extending along the vertical direction, wherein the first and third conductive structures are coupled to end portions of a sidewall of the first semiconductor channel, with the second conductive structure coupled to a middle portion of the sidewall of the first semiconductor channel;
   wherein the semiconductor device in the second area comprises:
   a second memory layer extending along the vertical direction;
   a second semiconductor channel extending along the vertical direction and coupled to a first portion of the second memory layer;
   fourth and fifth conductive structures extending along the vertical direction, wherein the fourth and fifth conductive structures are coupled to end portions of a sidewall of the second semiconductor channel, with no vertically extending conductive structure interposed between the fourth and fifth conductive structures.

2. The semiconductor device of claim 1, wherein the portion of the first memory layer, the first semiconductor channel, and the first through third conductive structures at least partially form a first string of first memory cells and a second string of first memory cells, and wherein the first portion of the second memory layer, the second semiconductor channel, and the fourth through fifth conductive structures at least partially form a first string of second memory cells, each of the first memory cells configured to store a single bit, and each of the second memory cells configured to store a pair of bits.

3. The semiconductor device of claim 2, wherein the semiconductor device in the second area further comprises:
   a third semiconductor channel extending along the vertical direction and coupled to a second portion of the second memory layer;
   eighth and ninth conductive structures extending along the vertical direction, wherein the eighth and ninth conductive structures are coupled to end portions of a sidewall of the third semiconductor channel, with no vertically extending conductive structure interposed between the eighth and ninth conductive structures;
   wherein the second portion of the second memory layer, the third semiconductor channel, and the eighth through ninth conductive structures at least partially form a second string of the second memory cells.

4. The semiconductor device of claim 1, wherein the first and third conductive structures are electrically connected to a first bit line driver, and the second conductive structure is electrically connected to a first source line driver.

5. The semiconductor device of claim 1, wherein the fourth conductive structure is electrically connected to a second bit line driver, and the fifth conductive structure is electrically connected to a second source line driver.

6. The semiconductor device of claim 1, wherein the semiconductor device in the first area further comprises a sixth conductive structure, extending along a lateral direction, that is coupled to the first semiconductor channel through the portion of the first memory layer.

7. The semiconductor device of claim 6, wherein the sixth conductive structure is electrically connected to a first word line driver.

8. The semiconductor device of claim 1, wherein the semiconductor device in the second area further comprises a seventh conductive structure, extending along a lateral direction, that is coupled to the second semiconductor channel through the first portion of the second memory layer.

9. The semiconductor device of claim 8, wherein the seventh conductive structure is electrically connected to a second word line driver.

10. A memory device, comprising:
    a first memory array, in a first area of a substrate, comprising a plurality of first memory cells; and
    a second memory array, in a second area of the substrate separated from the first area with an isolation structure, comprising a plurality of second memory cells;
    wherein two adjacent ones of the plurality of first memory cells, sharing a first memory layer and a first semiconductor channel, are operatively coupled to a common source line; and
    wherein each of the plurality of second memory cells, including a second memory layer and a second semiconductor channel, is operatively coupled to a respective single source line.

11. The memory device of claim 10, wherein the first and second memory arrays include stacks of the plurality of first memory cells and stacks of the plurality of second memory cells, respectively.

12. The memory device of claim 10, wherein each of the first memory cells is configured to store a single bit, and each of the second memory cells is configured to store a pair of bits.

13. The memory device of claim 10, wherein the two adjacent ones of the plurality of first memory cells are operatively coupled to different bit lines.

14. The memory device of claim 13, wherein the two adjacent ones of the plurality of first memory cells are operatively coupled to a common word line.

15. The memory device of claim 10, wherein each of the plurality of second memory cells is operatively coupled to a respective single bit line.

16. A memory device, comprising:
    a first memory array comprising a plurality of first memory cells;
    a second memory array comprising a plurality of second memory cells; and
    an isolation structure interposed therebetween the first memory array and the second memory array;
    wherein two adjacent ones of the plurality of first memory cells are operatively coupled to a common source line;
    wherein each of the plurality of second memory cells is operatively coupled to a respective single source line; and
    wherein each of the first memory cells is configured to store a single bit, and each of the second memory cells is configured to store a pair of bits.

17. The memory device of claim 16, wherein the two adjacent ones of the plurality of first memory cells are operatively coupled to different bit lines.

18. The memory device of claim 17, wherein the two adjacent ones of the plurality of first memory cells are operatively coupled to a common word line.

19. The memory device of claim 16, wherein each of the plurality of second memory cells is operatively coupled to a respective single bit line.

20. The memory device of claim 16, wherein the first and second memory arrays include stacks of the plurality of first memory cells and stacks of the plurality of second memory cells, respectively.

* * * * *